(12) United States Patent
Adams et al.

(10) Patent No.: US 7,205,913 B2
(45) Date of Patent: Apr. 17, 2007

(54) EFFICIENT DATA-DIRECTED SCRAMBLER FOR NOISE-SHAPING MIXED-SIGNAL CONVERTERS

(75) Inventors: Robert W. Adams, Acton, MA (US); Douglas J. Mar, Austin, TX (US); M. K. Stephen Yeung, Brighton, MA (US)

(73) Assignee: Analog Devices, Inc., Norwood, MA (US)

( * ) Notice: Subject to any disclaimer, the term of this patent is extended or adjusted under 35 U.S.C. 154(b) by 902 days.

(21) Appl. No.: 10/127,903

(22) Filed: Apr. 23, 2002

(65) Prior Publication Data

US 2003/0197633 A1 Oct. 23, 2003

(51) Int. Cl.
*H03M 5/00* (2006.01)

(52) U.S. Cl. .......................................... 341/60; 341/80

(58) Field of Classification Search ............ 341/50–90, 341/144–172
See application file for complete search history.

(56) References Cited

U.S. PATENT DOCUMENTS

| 5,631,649 | A  | * | 5/1997 | Nakamura ................. 341/144 |
| 6,137,430 | A  | * | 10/2000 | Lyden et al. ................ 341/144 |
| 6,326,980 | B1 | * | 12/2001 | Worley, III ................ 345/691 |

* cited by examiner

*Primary Examiner*—Lam T. Mai
(74) *Attorney, Agent, or Firm*—Wolf, Greenfield & Sacks, P.C.

(57) ABSTRACT

An efficient data-directed scrambler is provided for processing digital signals having an unequally-weighted code. The data-directed scrambler includes inputs for receiving unequally-weighted bits of an input signal, outputs for supplying N scrambled bits of an output signal, and two or more scrambler columns connected in series between the inputs and the outputs. One or more of the scrambler columns includes a swapper cell and a digital fanout. Least significant bits in the unequally-weighted code are input to a swapper cell, and higher order bits in the unequally-weighted code are input to respective digital fanouts. In the other embodiments, an efficient data-directed scrambler is provided for processing digital signals having an equally-weighted code.

48 Claims, 17 Drawing Sheets

| NORM/SWAP | OUT A | OUT B |
|---|---|---|
| 1 | IN A | IN B |
| 0 | IN B | IN A |

| CLOCK CYCLE | COLUMN 1 | COLUMN 2 |
|---|---|---|
| 3i + 0 | DIRECT | DIRECT |
| 3i + 1 | DIRECT | SHIFT |
| 3i + 2 | SHIFT | SHIFT |

EFFICIENT DATA-DIRECTED SCRAMBLER FOR NOISE-SHAPING MIXED-SIGNAL CONVERTERS

FIELD OF THE INVENTION

This invention relates to mixed-signal converters of the sigma-delta noise-shaping type and, more particularly, to mixed-signal converters that employ a multi-bit digital representation of the signal.

BACKGROUND OF THE INVENTION

Recently, sigma-delta, or noise-shaping, mixed-signal converters have come into widespread use. This type of converter uses a relatively coarse quantizer, usually a single bit, embedded in a feedback loop. The feedback loop causes the large quantization noise of the quantizer to become shaped in the frequency domain such that the noise over a small range of the spectrum is very low. The out-of-band noise is then removed by a digital filter in the case of an analog-to-digital converter, or an analog filter in the case of a digital-to-analog converter. Sigma-delta converters exhibit excellent linearity and low quantization noise.

An important feature exploited by noise-shaping mixed-signal converters is oversampling of the signal. This provides bandwidth into which the quantization noise can be transferred, and subsequently filtered, if desired. This procedure improves the resolution of the digital representation of the signal, but only within a relatively small signal bandwidth compared with the sampling frequency. Because these converters are typically designed to have a very high input resolution (often 20 or more bits, or one part in 1E+6) within their bandwidth specification, they are susceptible to imperfections, mismatch among circuit elements and thermal noise. Therefore, techniques that relax the design tolerances on specific electronic components are useful.

One of the primary obstacles in the design of noise-shaping mixed-signal converters is the problem of removing the large amount of out-of-band noise that is introduced by the digital modulator. Generally, this noise may be filtered, but the switched capacitor filter circuits typically used to accomplish this task are relatively expensive to build and may introduce nonlinear distortions. An alternative is to use multi-bit quantization, in which the digital word consists of more than a single bit. This approach can reduce the quantization noise directly.

An important element in multi-bit noise-shaping mixed-signal converters is the digital-to-analog converter (DAC) circuitry. In multi-bit digital-to-analog (D/A) converters, the DAC structure forms the desired output, whereas in multi-bit analog-to-digital (A/D) converters, the DAC constitutes an important element in the feedback loop. Typically, the DAC structure is configured by using a number N of nominally identical elements, each of which is a 1-bit DAC and provides a unit contribution (either 0 or 1) to a summing junction. The summed output forms the multi-bit DAC output.

Because of actual circuit nonidealities, such as mismatches between capacitors in an array of N capacitors in a switched capacitor array, the beneficial effects of the multi-bit feedback are lost due to the inherent nonlinearity caused by the mismatch. This nonlinearity directly leads to increased quantization noise and harmonic distortion within the signal bandwidth and can significantly degrade the performance of the converter.

A number of methods have been proposed and implemented for counteracting the effects of such mismatches. Many of these methods involve a form of randomization or rotation of the bits that specify which of the individual DACs are to be selected and which are to be deselected in a given clock cycle in an effort to even out, or to average, mismatches. Examples are disclosed in L. R. Carley, "A Noise-Shaping Coder Topology for 15+ Bit Converters," *IEEE J. Solid State Circuits*, SC-24, No. 2, pages 267–273, Apr. 1989; U.S. Pat. No. 5,406,283 issued Apr. 11, 1995 to Leung; and U.S. Pat. No. 5,856,799 issued Jan. 5, 1999 to Hamasaki et al. The main drawback of the disclosed methods is that they typically require many clock cycles to achieve the desired averaging, especially when the number of elements is large. This results in low frequency noise and may thereby degrade the performance in the passband of the converter.

U.S. Pat. No. 5,986,595 issued Nov. 16, 1999 to Lyden et al. attempts to address this problem by replacing the rotations with a more sophisticated sorting procedure that requires extra complexity in the circuitry. U.S. Pat. No. 5,684,482 issued Nov. 4, 1997 to Galton extends these ideas to handle the case of increased shaping order, but at the cost of introducing more complex switching logic as well as a nonlocal memory, which can be costly to implement in circuit layout. Moreover, Galton's method works only for the case where the number of elements is equal to an integer power of 2.

U.S. Pat. No. 5,404,142 issued Apr. 4, 1995 to Adams et al. discloses a data-directed scrambling technique that relieves the burden of tight analog component matching. The quantized noise-shaped word is first converted to a "thermometer code", where for an R-bit quantized word, $2^R$ equally-weighted elements are used. In the thermometer code, the number of output bits set to one is equal to the input value. The fact that the output bits are equally-weighted allows dynamic mapping of digital input bits to analog elements of the digital-to-analog converter. By using an array of swapping elements whose state is controlled by the data itself, errors caused by analog mismatches can be manipulated, thereby shaping the noise in the output spectrum. Therefore, most of the noise energy is outside the band of interest.

In the technique disclosed by Adams et al., each of the switching units, called a "2×2 swapper cell," has two inputs and two outputs, and these units are arranged in a "butterfly architecture" similar to one commonly used in Fast Fourier Transform (FFT) algorithms. To further reduce the pattern tones, a randomizing pre-shifter can be used, as in the AD1853, a stereo multi-bit sigma-delta DAC sold by Analog Devices, Inc. The advantages of this method include its simple logic, which is local, and requires only 1-bit memories, and its efficiency: only $(N/2) \log_2 N$ switching units are required for a thermometer encoder with N input levels. However, one restriction of this method is that it works only when the bits of the input data word are equally-weighted.

A copending application filed Feb. 8, 2002 and entitled "Data-Directed Scrambler For Noise-Shaping Mixed-Signal Converters With An Arbitrary Number Of Quantization Levels", attorney's docket number A0312/7421, discloses a scrambling technique that can be used for an arbitrary number of input levels. However, the disclosed method is also restricted to equally-weighted input digital signals.

Accordingly, it is desirable to provide scrambling methods and apparatus for noise-shaping mixed-signal converters wherein one or more of the above drawbacks are overcome.

It is also desirable to provide efficient scrambling methods and apparatus for equally-weighted input codes.

SUMMARY OF THE INVENTION

According to an aspect of the invention, a scrambling system is provided that can accept digital codes with an arbitrary number of bits of unequal weights. The scrambling system includes a data-directed scrambler having swapper cells, each of which connects its two inputs to its two outputs, either directly or reversely, depending on the state of the two inputs and an additional state bit that represents the integrated difference of past swapper cell outputs. A digital signal with an unequally-weighted code is input to the scrambling system. The unequally-weighted code is converted into an equivalent structured equally-weighted code, which is then processed by the swapper cells.

According to a first aspect of the invention, a data-directed scrambler is provided for processing digital signals having an unequally-weighted code. The data-directed scrambler comprises inputs for receiving unequally-weighted bits of an input signal, outputs for supplying N scrambled bits of an output signal, and two or more scrambler columns connected in series between the inputs and the outputs. One or more of the scrambler columns includes a swapper cell and a digital fanout. Least significant bits in the unequally-weighted code are input to a swapper cell, and higher order bits in the unequally-weighted code are input to respective digital fanouts.

In one embodiment, where $N=2^k$ and k is an integer, the data-directed scrambler includes k scrambler columns. In this embodiment, successive scrambler columns process progressively higher weights in the unequally-weighted code. The unequally-weighted code may have relative bit weights of $1, 1, 2, 4, 8, 16, \ldots, 2^{k-1}$.

In another embodiment, where $N=M\times 2^k$, k is an integer and M is an odd integer, the data-directed scrambler includes k+p scrambler columns, where p is the next integer greater than or equal to $\log_2 M$. The unequally-weighted code may have a structure including M code sets, each code set having relative bit weights of $1, 1, 2, 4, 8, 16, \ldots, 2^{k-1}$. The first k scrambler columns of the data-directed scrambler each comprise M sets of circuit elements. The M sets of circuit elements process respective ones of the M code sets. The last p scrambler columns may comprise swapper cells and direct connections for swapping the M code sets.

According to a second aspect of the invention, apparatus is provided for processing digital signals having an unequally-weighted code. The apparatus comprises a data-directed scrambler and a rotator. The data-directed scrambler has inputs for receiving the digital signals and N outputs, where $N=M\times 2^k$, k is an integer and M is an odd integer. The data-directed scrambler comprises two or more scrambler columns connected in series between the inputs and the N outputs. One or more of the scrambler columns includes a swapper cell and a digital fanout. The rotator advances the inputs to the data-directed scrambler through M rotator states. The inputs of the rotator are shifted by 0, N/M, 2N/M, . . . , (M−1) N/M steps in respective rotator states.

According to a third aspect of the invention, a data-directed scrambler is provided for processing digital signals. The data-directed scrambler comprises inputs for receiving the digital signals and N outputs, wherein $N=2^k$ and k is an integer, and k scrambler columns are connected in series between the inputs and the N outputs. The jth scrambler column includes $2^{j-1}$ swapper cells for j=1 to k.

According to a fourth aspect of the invention, a data-directed scrambler is provided for processing digital signals having a structured equally-weighted code, wherein bits of the code that are constrained to be all on or all off are assigned to bit groups. The data-directed scrambler comprises inputs for receiving N bits of an input signal having the structured equally-weighted code, outputs for supplying N scrambled bits of an output signal, and two or more scrambler columns connected in series between the inputs and the outputs, each of the scrambler columns including at least one swapper cell. Bit groups of the structured equally-weighted code are input to respective scrambler columns in accordance with the number of bits in the bit groups.

According to a fifth aspect of the invention, a method is provided for processing digital signals having an unequally-weighted code. The method comprises the steps of providing a data-directed scrambler including inputs for receiving unequally-weighted bits of an input signal, outputs for supplying N scrambled bits of an output signal, and two or more scrambler columns connected in series between the inputs and the outputs, one or more of the scrambler columns including a swapper cell and a digital fanout, supplying least significant bits in the unequally-weighted code to a swapper cell, and supplying higher order bits in the unequally-weighted code to respective digital fanouts.

According to a sixth aspect of the invention, a method is provided for processing digital signals having a structured equally-weighted code, wherein bits of the code that are constrained to be all on or all off are assigned to bit groups. The method comprises the steps of providing a data-directed scrambler including inputs for receiving N bits of an input signal having the structured equally-weighted code, outputs for supplying N scrambled bits of an output signal, and two or more scrambler columns connected in series between the inputs and the outputs, each of the scrambler columns including at least one swapper cell, and processing bit groups of the structured equally-weighted code in respective scrambler columns in accordance with the number of bits in the bit groups.

According to a seventh aspect of the invention, a digital-to-analog converter incorporating one of the efficient scramblers described above is provided. The digital-to-analog converter comprises one of the efficient data-directed scramblers described above for receiving a digital signal and supplying N scrambled bits of the digital signal, a digital-to-analog converter circuit including N equally-weighted digital-to-analog converter elements for converting the scrambled bits to respective analog values, and a summing circuit for summing the analog values to produce an analog output that represents the digital signal.

According to an eighth aspect of the invention, an analog-to-digital converter incorporating one of the efficient scramblers described above is provided. The analog-to-digital converter comprises a summing unit for subtracting a feedback signal from an analog input signal and providing a summing unit output, a loop filter for receiving the summing unit output and providing a filter output signal, a multi-bit quantizer for providing a digital output in response to the filter output signal, and a digital-to-analog converter responsive to the digital output for providing the feedback signal to the summing unit. The digital-to-analog converter may be configured as described above. The digital output of the multi-bit quantizer represents the analog input signal.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
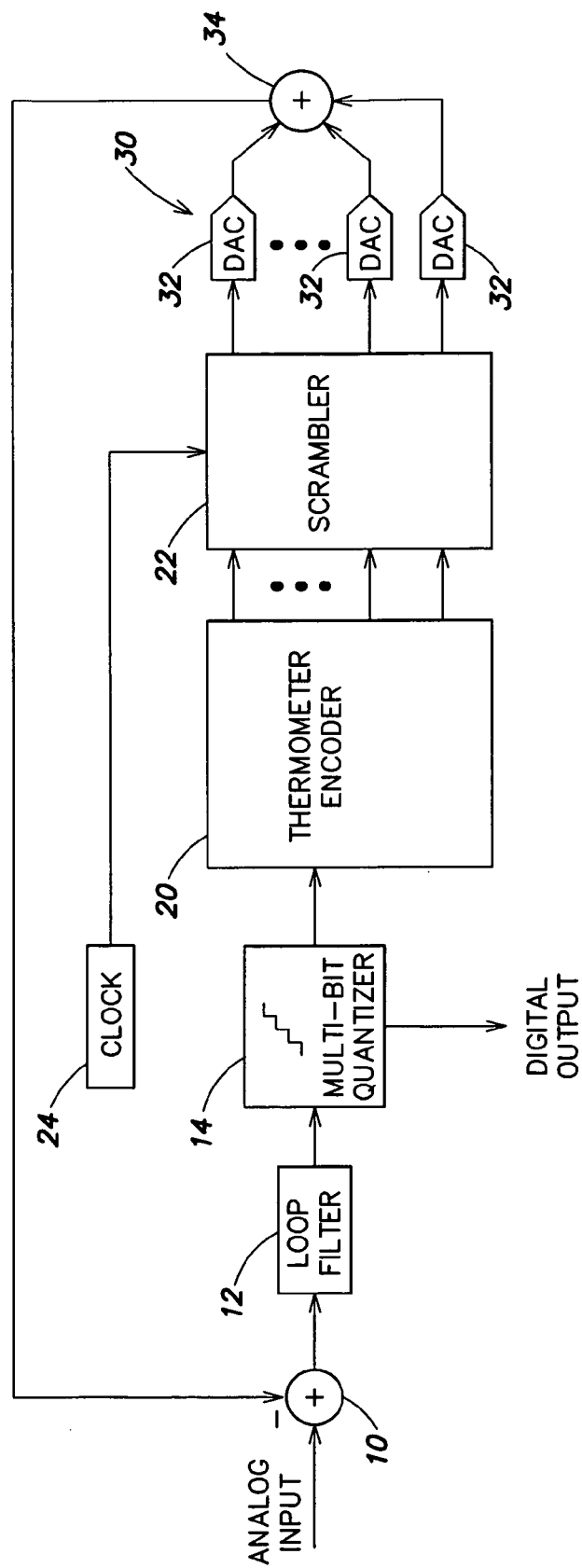
FIG. 1 is a block diagram of a prior art multi-bit noise-shaping analog-to-digital converter with a thermometer encoder and a scrambler in the feedback path.

A prior art multi-bit noise-shaping analog-to-digital converter utilizing a data-directed scrambler, as disclosed in the aforementioned U.S. Pat. No. 5,404,142 to Adams et al., is described with reference to FIGS. 1–4. As shown in FIG. 1, an analog input is supplied through a summing circuit 10 to a loop filter 12. A multi-bit quantizer 14 converts the analog output of loop filter 12 to a digital output and supplies an output to a thermometer encoder 20. The thermometer encoder 20 supplies one bit for each quantization level, and the number of output bits set to one is equal to the input value. The outputs of the thermometer encoder 20 are equally-weighted. The equally-weighted output bits of thermometer encoder 20 are supplied to a scrambler 22. The equally-weighted input bits are dynamically mapped by scrambler 22 to its outputs such that the inputs are equally represented in the outputs over a relatively small number of clock cycles. A clock 24 supplies a clock signal to scrambler 22. The outputs of scrambler 22 are supplied to a digital-to-analog converter 30 including nominally equally-weighted DAC elements 32 and a summing circuit 34. The analog outputs of DAC elements 32 are summed by summing circuit 34, and the sum is subtracted from the analog input by summing circuit 10 to form a closed loop. In the configuration of FIG. 1, the number N of quantization levels in the scrambler 22 is limited to an integer power of 2, and the inputs to scrambler 22 are required to have an equally-weighted code.

Figure 2:
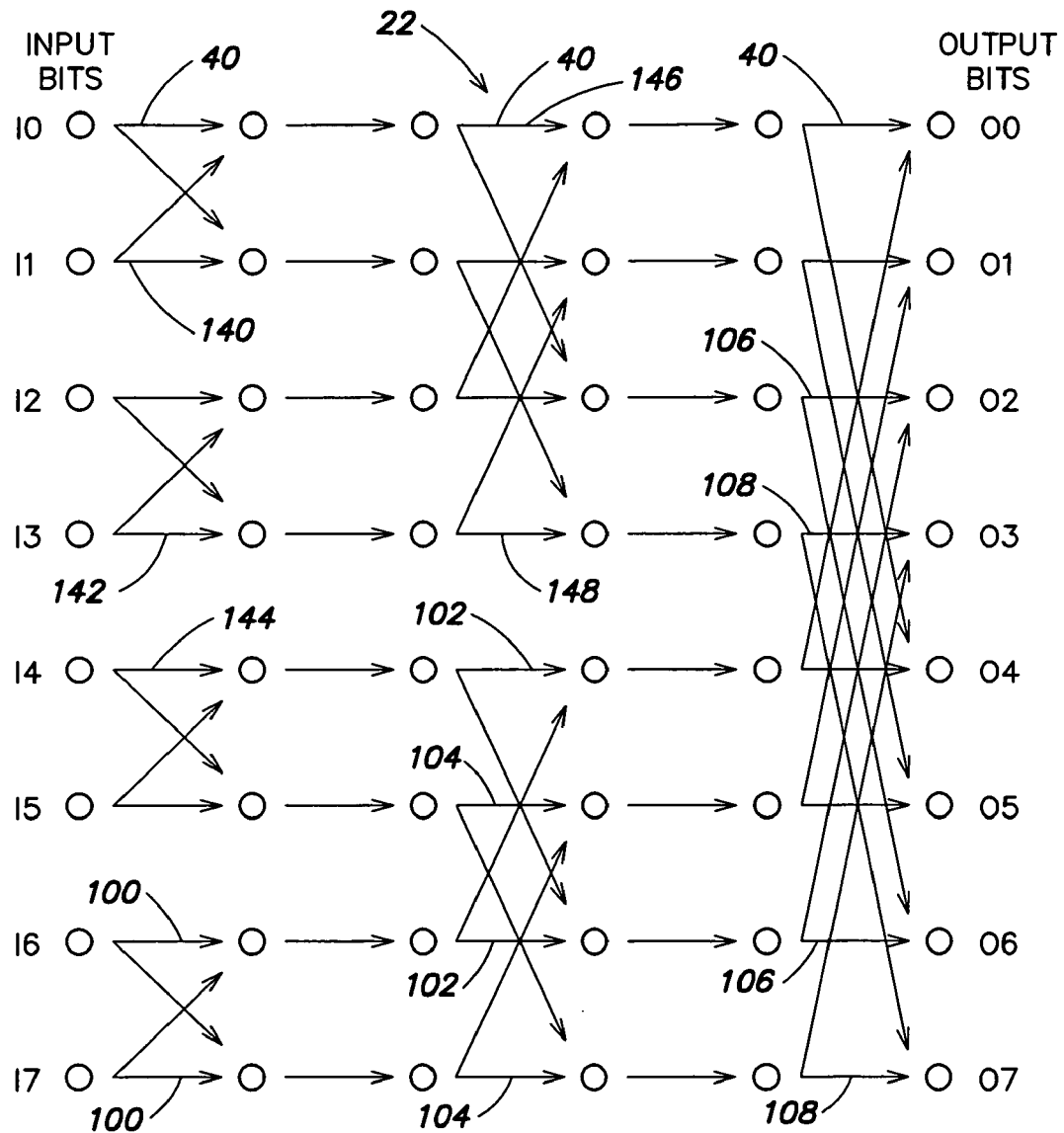
FIG. 2 is a schematic block diagram of an eight-input scrambler with equally-weighted inputs.

A schematic block diagram of scrambler 22 is shown in FIG. 2 for the case N=8. Scrambler 22 includes data-directed swapper cells 40 connected in an FFT-like butterfly configuration. In the context of FFT, the topology of FIG. 2 is the flow graph of a radix-2 decimation in frequency FFT algorithm, with inputs in bit-reversed order and outputs in normal order. The scrambler 22 of FIG. 2 has N=8 inputs and N outputs.

Figures 3A, 3B:
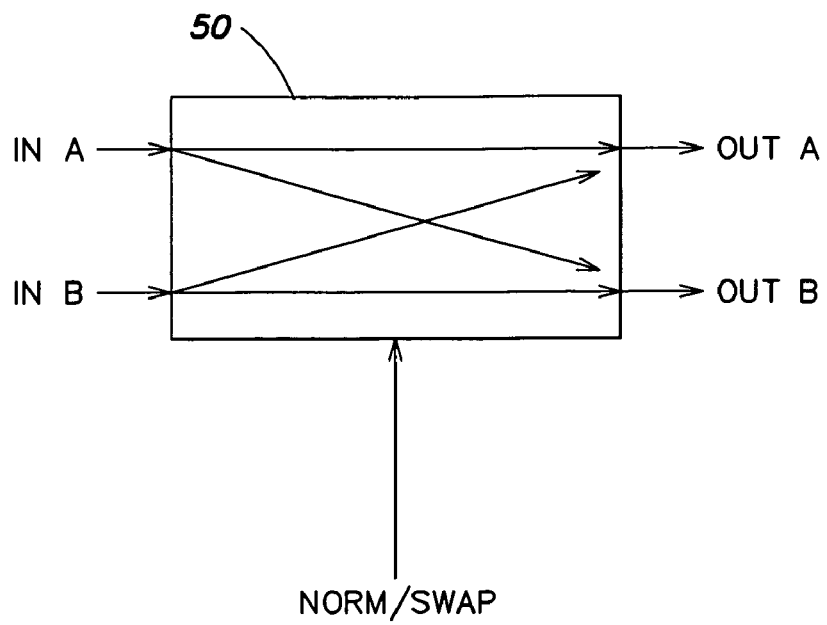
FIG. 3A is a schematic diagram of a switching circuit used in the scrambler of FIG. 2.
FIG. 3B is a table that illustrates the states of the switching circuit shown in FIG. 3A.

As shown in FIGS. 3A and 3B, each swapper cell 40 includes a switching circuit 50 that connects inputs A and B to outputs A and B, either directly or reversely, in response to a normal/swap control signal. As described in the aforementioned U.S. Pat. No. 5,404,142, the control signal is supplied by logic circuitry which responds to the states of the inputs of the swapper cell and the state of a difference signal developed as the integrated difference of prior swapper output signals. The functioning of the scrambler thus is controlled by the actual received data. This has the effect of shifting the noise due to an error in weighting to higher frequencies, out of the passband.

Referring again to FIG. 2, scrambler 22 includes three columns of swapper cells connected in series between inputs I0, I1, . . . , I7 and outputs O0, O1, . . . , O7. In operation, scrambler 22 maps its inputs to its outputs in a manner disclosed in U.S. Pat. No. 5,404,142 with the result that the usage of the outputs O0, O1, . . . , O7 is balanced over a relatively small number of clock cycles.

Figure 4:
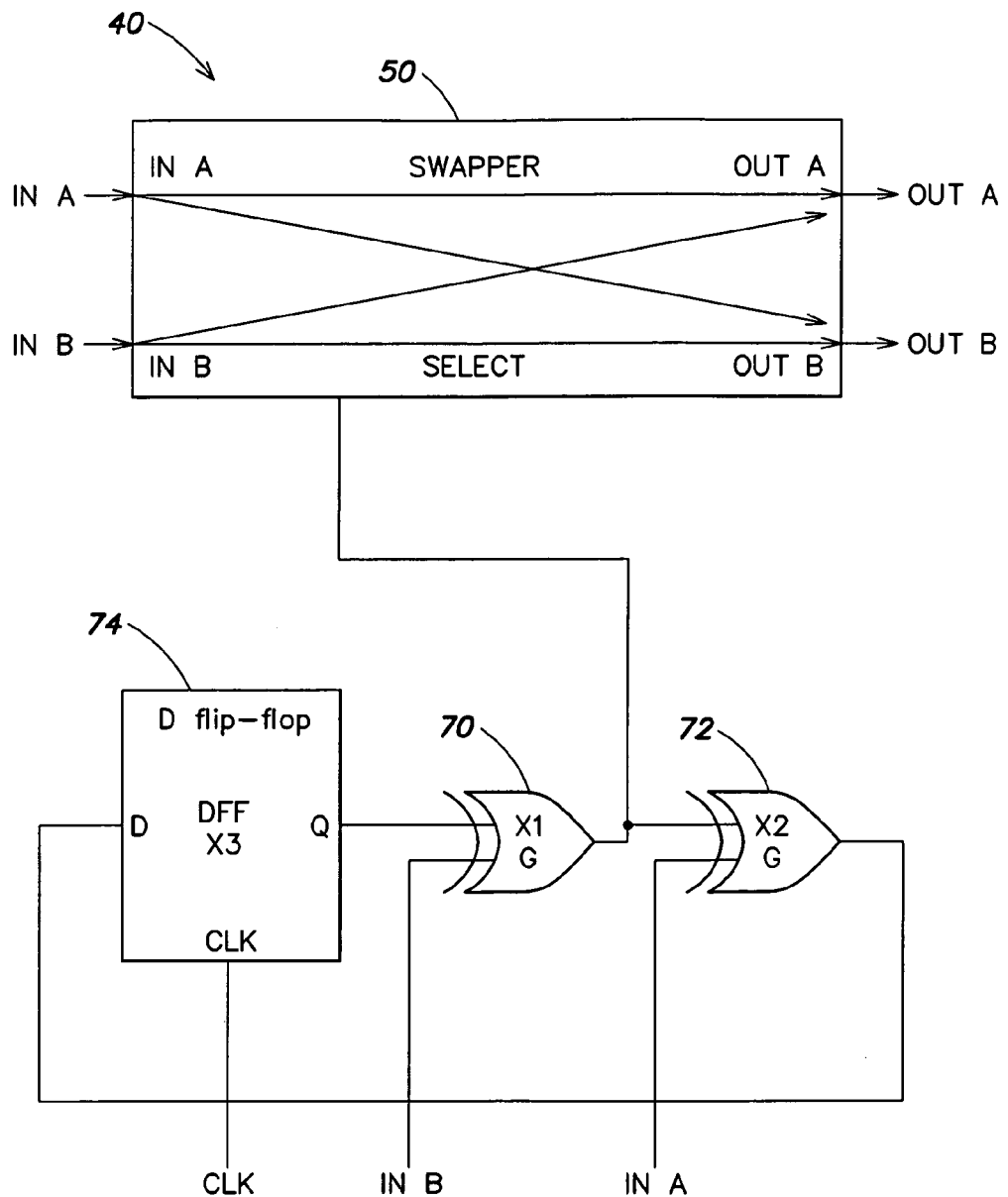
FIG. 4 is a block diagram of an embodiment of a data-directed swapper cell.

An embodiment of swapper cell 40 is shown in FIG. 4. Swapper cell 40 includes switching circuit 50, exclusive OR gates 72 and 70 that receive inputs A and B, respectively, and flip-flop 74 that receives the output of exclusive OR gate 72 and supplies an input to exclusive OR gate 70. The output of exclusive OR gate 70 provides the control signal to switching circuit 50.

A restriction on the prior art data-directed scrambling technique described above and in U.S. Pat. No. 5,404,142 is that it works only when the bits of the input data word are equally-weighted. In some applications, this restriction may produce inefficiencies.

A feature of the present invention is based on converting an unequally-weighted digital code into a structured equally-weighted code in successive stages, and then taking advantage of the structured code to perform efficient scrambling using a small number of swapper cells. The prior art architectures employ a number of swapper cells arranged in an FFT-like butterfly architecture, with each of the swapper cells activated to a swap or no swap condition by a control signal that is derived by performing logical operations on the incoming data signals and a signal developed as the integrated difference of past output signals of the swapper cell. By choosing appropriate logical operations, it is possible to shape the circuit mismatch. However, these architectures work only if the input is an equally-weighted code, such as a thermometer code.

In embodiments of the present invention, a scrambler is provided that is capable of processing an unequally-weighted input code. As used herein, an unequally-weighted code is a digital code where not all the bits of a digital value or digital word have the same weight. However, two or more bits of the code may have the same weight. The scrambler includes swapper cells and a hierarchy of digital fanouts that convert, in successive stages, each component of the unequally-weighted code to a corresponding structured equally-weighted code. The structure of the scrambler is discussed in detail below.

According to another aspect of the present invention, a thermometer code, such as is used in sigma-delta analog-to-digital converters, can be converted into an unequally-weighted code. The unequally-weighted code is processed as described above. The scrambler for processing the unequally-weighted code achieves the same result but requires fewer swapper cells than prior art scramblers configured for processing the thermometer code.

As noted above, the input to the prior art scrambler must utilize an equally-weighted code. Such code is known to be an inefficient way of representing digital values. Each element carries the same weight, and the only relevant information is the number of inputs that are selected. The equally-weighted code contains considerable redundancy.

One of the objectives of the present invention is to remove the restriction that requires an equally-weighted code as the input to a scrambler. To explain the idea underlying the present invention, first consider the binary code as an example. As is well known, the binary code is a very efficient method of representing digital values. Thus, with k elements, whose weights are $1, 2, 4, 8, 16, \ldots, 2^{k-1}$, it is possible to represent integer values in the range $[0, 1, 2, 3, 4, \ldots, N-1]$, where $N=2^k$. There is no redundancy as in the case of equally-weighted codes. However, this efficiency is incompatible with scrambling. Since no two elements carry the same weight, the code cannot be scrambled.

From the above discussion, it is apparent that it is desirable to combine the efficiency of the binary code and the noise-shaping features of scrambling. One prior art approach is to first convert the binary code into a thermometer code which has equal weights, and then use a standard scrambler of the type shown in FIG. 2. However, this defeats the purpose of using a binary code, since $(N/2) \log_2 N$ swapper cells are required, as in the case where a thermometer code is used. By exploiting certain structures of the binary code and by converting bits of the binary code to a number of equally-weighted bits in stages, the present invention achieves the same scrambling result using only $N-1$ swapper cells, for the case where N is an integer power of 2. This represents a significant improvement over the prior art. If the input consists of a thermometer code, the thermometer code can be converted into a binary code and then the present invention can be utilized. In this context, the present invention represents an efficient method of scrambling a thermometer code using only $N-1$ instead of $(N/2) \log_2 N$ swapper cells, for the case where N is an integer power of 2.

The scrambler architecture of FIG. 2 is designed to receive a thermometer code as its input. In such a code, the only relevant quantity is the total number of thermometer bits that are selected. It does not matter which bits are turned on and which bits are turned off. Thus, the bits may be rearranged so that the code has a binary structure. That is, for an input with $N=2^k$ equally-weighted bits, the first $2^{k-1}$ bits are constrained to be either all on or all off, and the next $2^{k-2}$ bits are similarly constrained, etc. In order to represent all possible integer values in the range $[0, 1, 2, 3, 4, \ldots, N]$ and not just $[0, 1, 2, 3, 4, \ldots, N-1]$, two bits with unit weights are used. Thus, the weights of the bits are $1, 1, 2, 4, 8, 16, \ldots, 2^{k-1}$. Such a modified binary code can be obtained from a binary code using standard devices.

Figure 5:
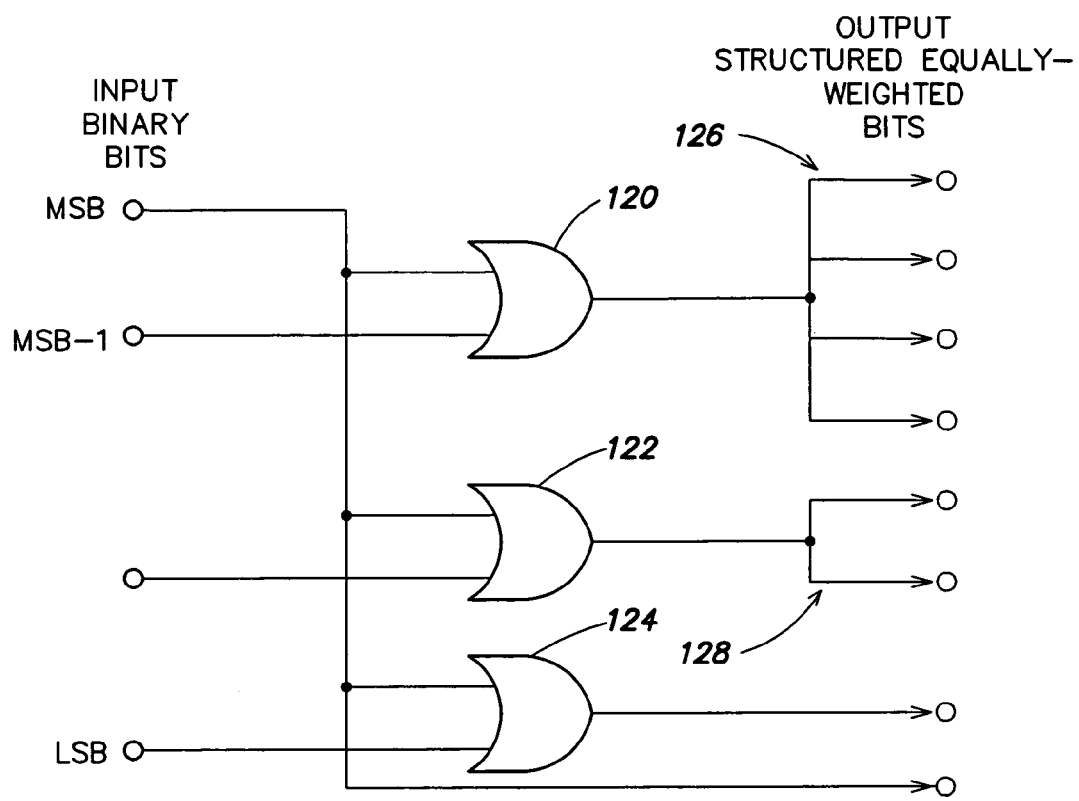
FIG. 5 is a block diagram of a code converter for converting a binary code to a structured equally-weighted code for N=8.

A code converter for the case N=8 is shown in FIG. 5. The code converter of FIG. 5 uses OR gates 120, 122, and 124, and digital fanouts 126 and 128. Each digital fanout maps a single input bit to two or more output bits. Thus, for example, digital fanout 128 maps the output of OR gate 122 to two output bits, and digital fanout 126 maps the output of OR gate 120 to four output bits.

Figure 6:
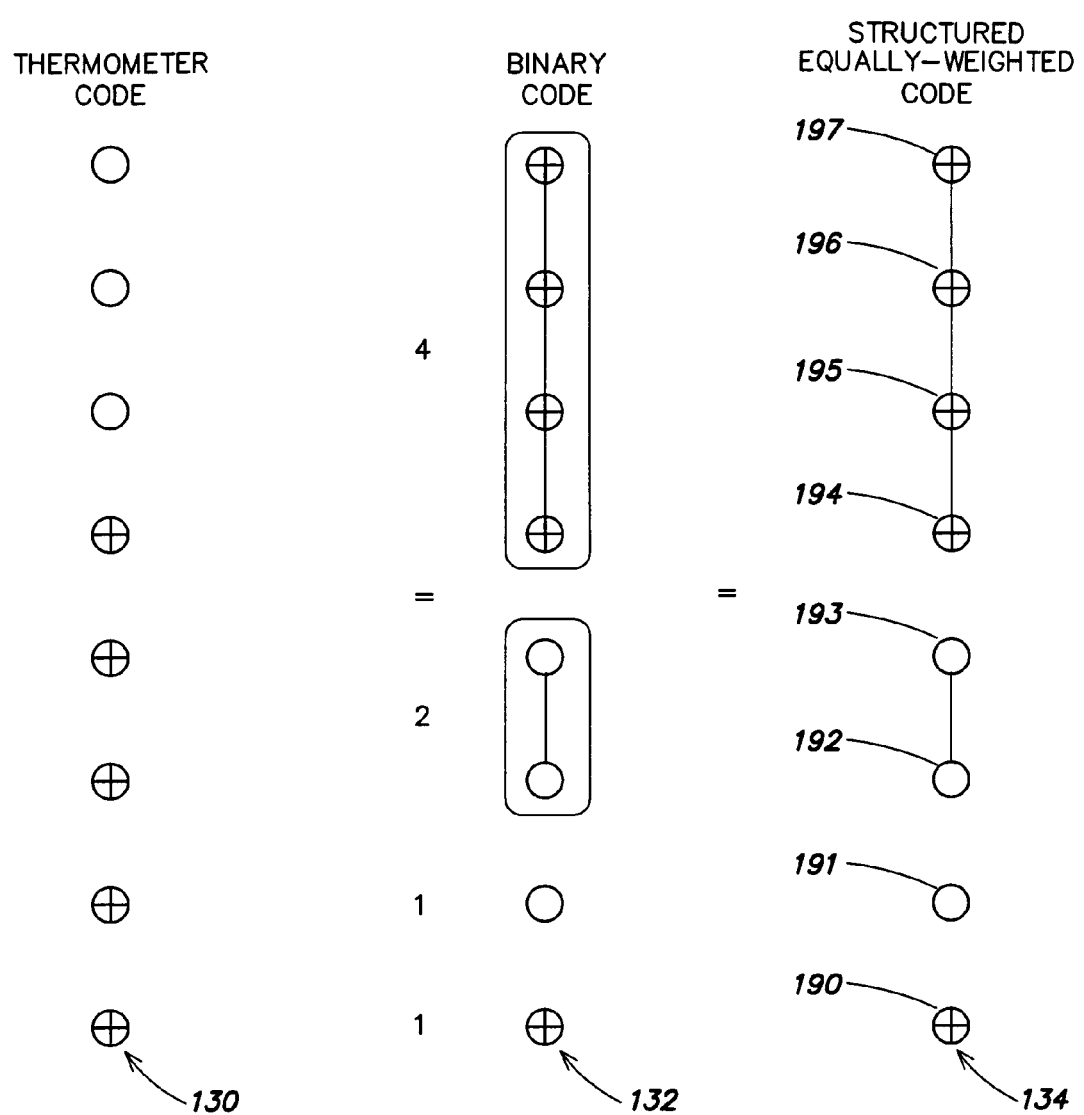
FIG. 6 is a schematic representation of digital values by a thermometer code, a modified binary code and a structured equally-weighted code, where N=8 and the input value is 5.

The different code representations are shown in FIG. 6 for the case of N=8 input levels and an input value of 5. A thermometer code 130, a modified binary code 132 and a structured equally-weighted code 134 are shown. Instead of representing the input value 5 using the thermometer code $$5=0+0+0+1+1+1+1+1,$$

the modified binary code or the structured equally-weighted code can be used:

$$5 = (1 \times 4) + (0 \times 2) + (0 \times 1) + (1 \times 1) = (1 + 1 + 1 + 1) + (0 + 0) + 0 + 1.$$

The structured equally-weighted code 134 may be supplied to the scrambler shown in FIG. 2, and the same result is obtained as if the thermometer code 130 was input to the scrambler, as they both have the same number of equally-weighted bits that are turned on.

With the structured equally-weighted input code, it can be seen that many of the swapper cells in the scrambler of FIG. 2 are superfluous and can be replaced by direct connections, because the two inputs of these swapper cells are constrained to be either both on or both off. Where the two swapper cell inputs are the same, the swap and the no swap states produce the same output. Accordingly, in the scrambler of FIG. 2, swapper cells 140, 142, 144, 146 and 148 are not needed for the structured equally-weighted code 134 of FIG. 6. In particular, only $2^{j-1}$ swapper cells are necessary in the jth column, for $j=1,2,3, \ldots, k=\log_2 N$. As a result, the scrambler architecture shown in FIG. 7A may be utilized for the case N=8. The scrambler of FIG. 7A uses $N-1$ swapper cells.

Figure 7A:
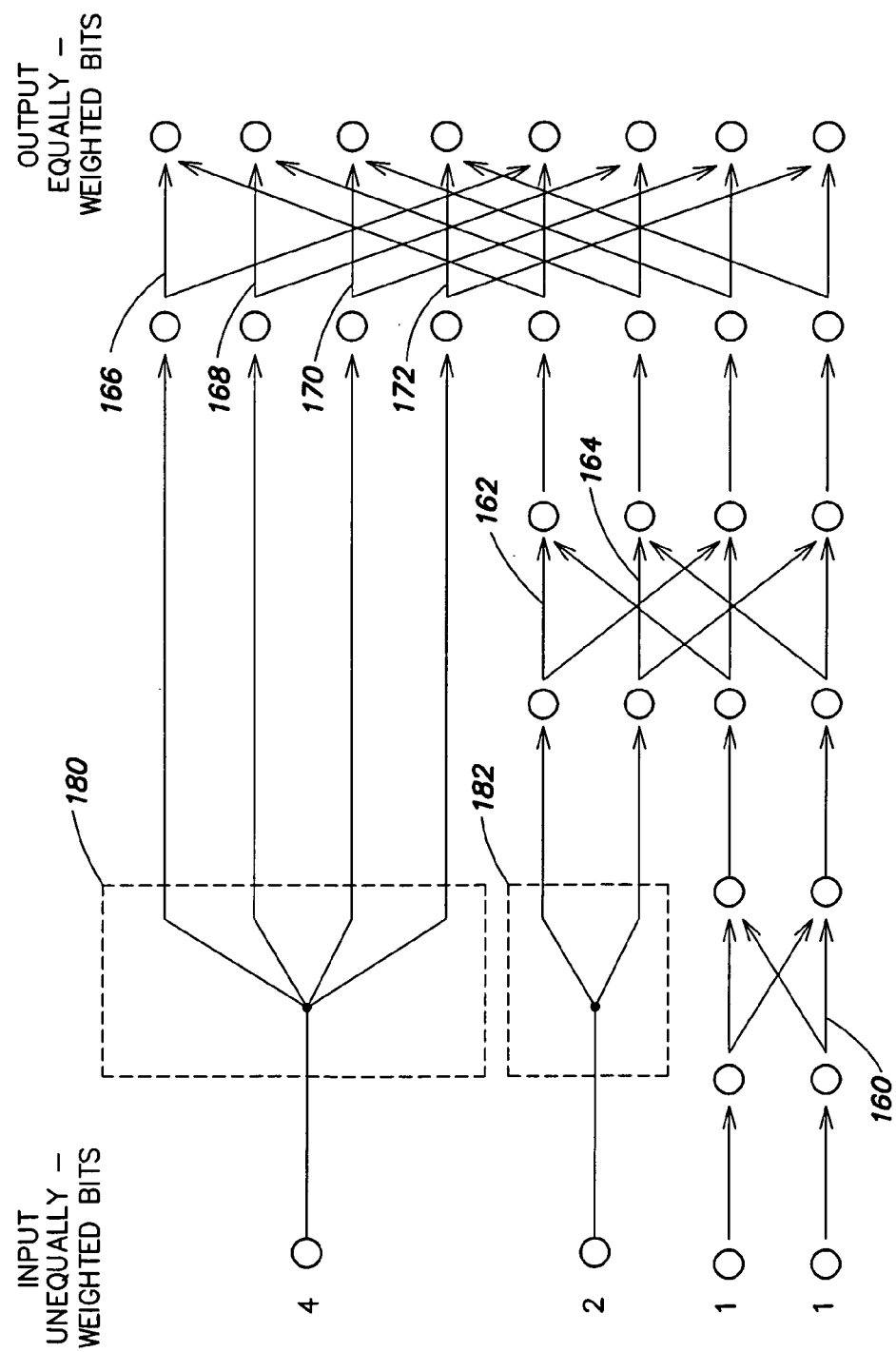
FIG. 7A is a schematic diagram of an example of an efficient scrambler for N=8 with an unequally-weighted code as input.

The scrambler of FIG. 7A includes scrambler cells 160, 162, 164, 166, 168, 170 and 172, and digital fanouts 180 and 182. Digital fanout 180 replaces swapper cells 140, 142, 146 and 148 in FIG. 2, and digital fanout 182 replaces swapper cell 144 in FIG. 2. In the embodiment of FIG. 7A, digital fanouts 180 and 182 are located in the first column of the scrambler.

As a further simplification, it may be noted that in the jth column, only the lower $2^j$ levels are involved with swapper cells. The higher $2^k-2^j$ levels are idle. Thus, there is no need to convert the binary bit representing $2^j$ into the equivalent $2^j$ equally-weighted bits until those bits are ready to be swapped in the jth column. For this reason, the scrambler shown in FIG. 7B may be utilized for the case N=8. The conversion of the binary bits to the corresponding equally-weighted levels is carried out in successive stages.

Figure 7B:
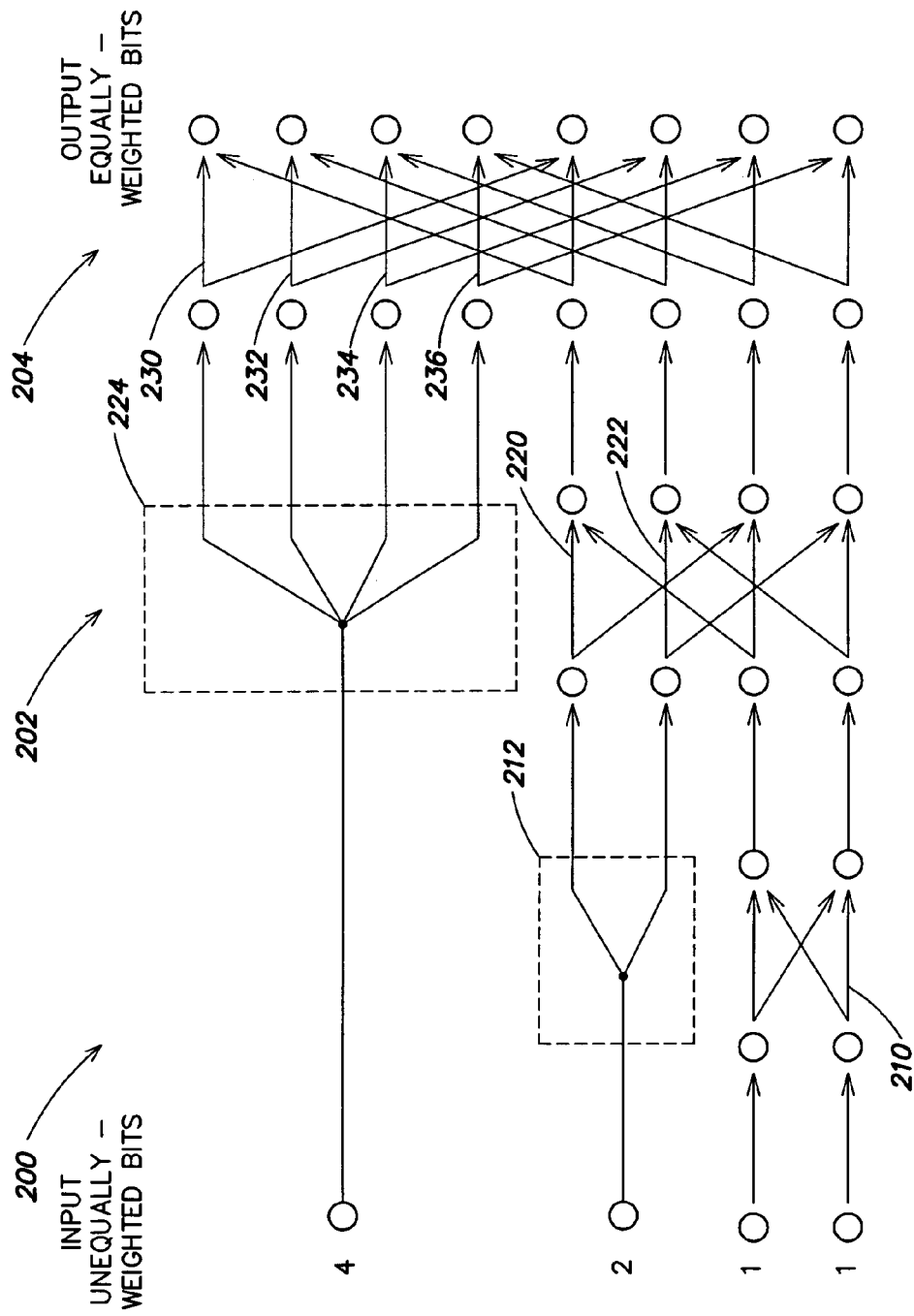
FIG. 7B is a schematic diagram of a modification of the efficient scrambler shown in FIG. 7A, wherein conversion of the unequally-weighted code to a structured equally-weighted code is performed in stages.

The scrambler of FIG. 7B includes k=3 columns, including first column 200, second column 202 and third column 204 connected in series between the inputs and the outputs of the scrambler. First column 200 includes a swapper cell 210 and a two-output digital fanout 212. Swapper cell 210 processes (swaps or does not swap) the two least significant bits of the input, while digital fanout 212 converts the next LSB (least significant bit) into two equally-weighted bits to be processed in second column 202. Second column 202 includes swapper cells 220 and 222, and a four-output digital fanout 224. Swapper cells 220 and 222 process the outputs of swapper cell 210 and digital fanout 212 in first column 200, while digital fanout 224 converts the MSB (most significant bit) into four equally-weighted bits to be processed in third column 204. Digital fanouts 212 and 224 correspond to digital fanouts 128 and 126, respectively, shown in FIG. 5. Third column 204 includes swapper cells 230, 232, 234 and 236, which process the outputs of swapper cells 220 and 222 and digital fanout 224 in second column 202. The scrambler of FIG. 7B thus includes 7 swapper cells and 2 digital fanouts, as compared with the scrambler of FIG. 2 which includes 12 swapper cells. The two scramblers produce the same outputs, but the scrambler of FIG. 7B requires less circuitry.

Figure 8:
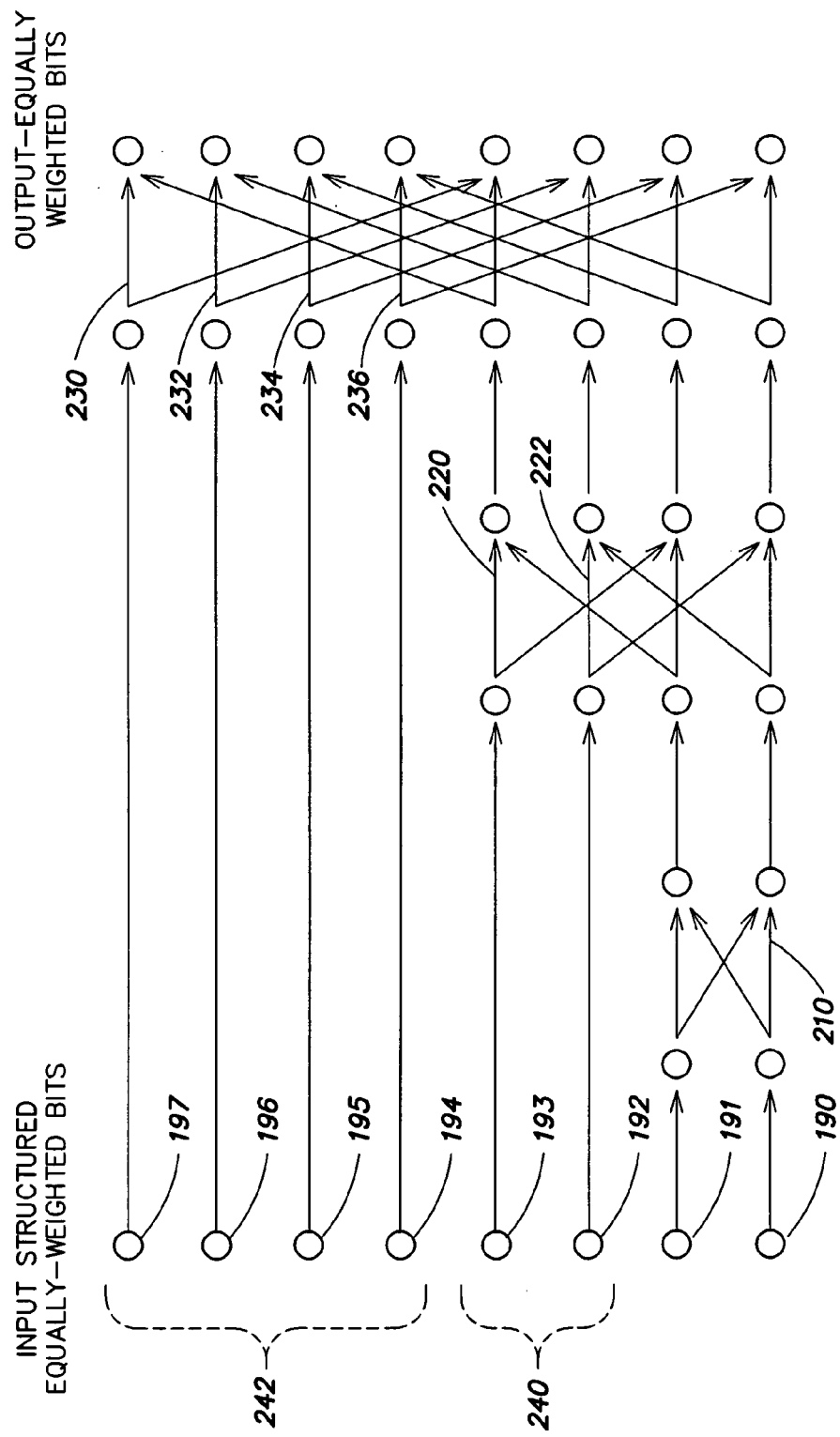
FIG. 8 is a schematic diagram of an example of an efficient scrambler for N=8 with a structured equally-weighted code as input.

An efficient scrambler for processing a structured equally-weighted code is shown in FIG. 8. Like elements in FIGS. 7B and 8 have the same reference numerals. The embodiment of FIG. 8 may be utilized to process the structured equally-weighted code 134 shown in FIG. 6. In the structured equally-weighted code, bits of the code that are constrained to be all on or all off are assigned to bit groups. Bit groups of the structured equally-weighted code are input to scrambler columns in accordance with the number of bits in each bit group. Bits 190 and 191 are input to swapper cell 210 of the first scrambler column. Bits 192 and 193 are constrained to be both on or both off and are assigned to a bit group 240. Bits 192 and 193 are input to swapper cells 222 and 220, respectively, of the second scrambler column. Bits 194, 195, 196 and 197 are constrained to be all on or all off and are assigned to a bit group 242. Bits 194, 195, 196 and 197 are input to swapper cells 236, 234, 232 and 230, respectively, of the third scrambler column. By comparison of FIGS. 2 and 8, it is apparent that the structured equally-weighted code permits a reduction in a required number of swapper cells, as compared with an unstructured equally-weighted code.

Each of the scrambler architectures shown in FIGS. 7A, 7B and 8 has N outputs, where N is an integer power of 2. It will be understood that the scrambler architectures shown in FIGS. 7A, 7B and 8 can be configured for larger or smaller values of N. For example, a scrambler for the case N=16 requires the addition of a fourth column having 8 scrambler cells and, in the architecture of FIG. 7B, the addition to the third column of a digital fanout having 8 outputs. Such an architecture utilizes N−1 swapper cells and ($\log_2$ N−1) digital fanouts, compared to N/2 $\log_2$ N swapper cells in the architecture of U.S. Pat. No. 5,404,142.

Figure 9:
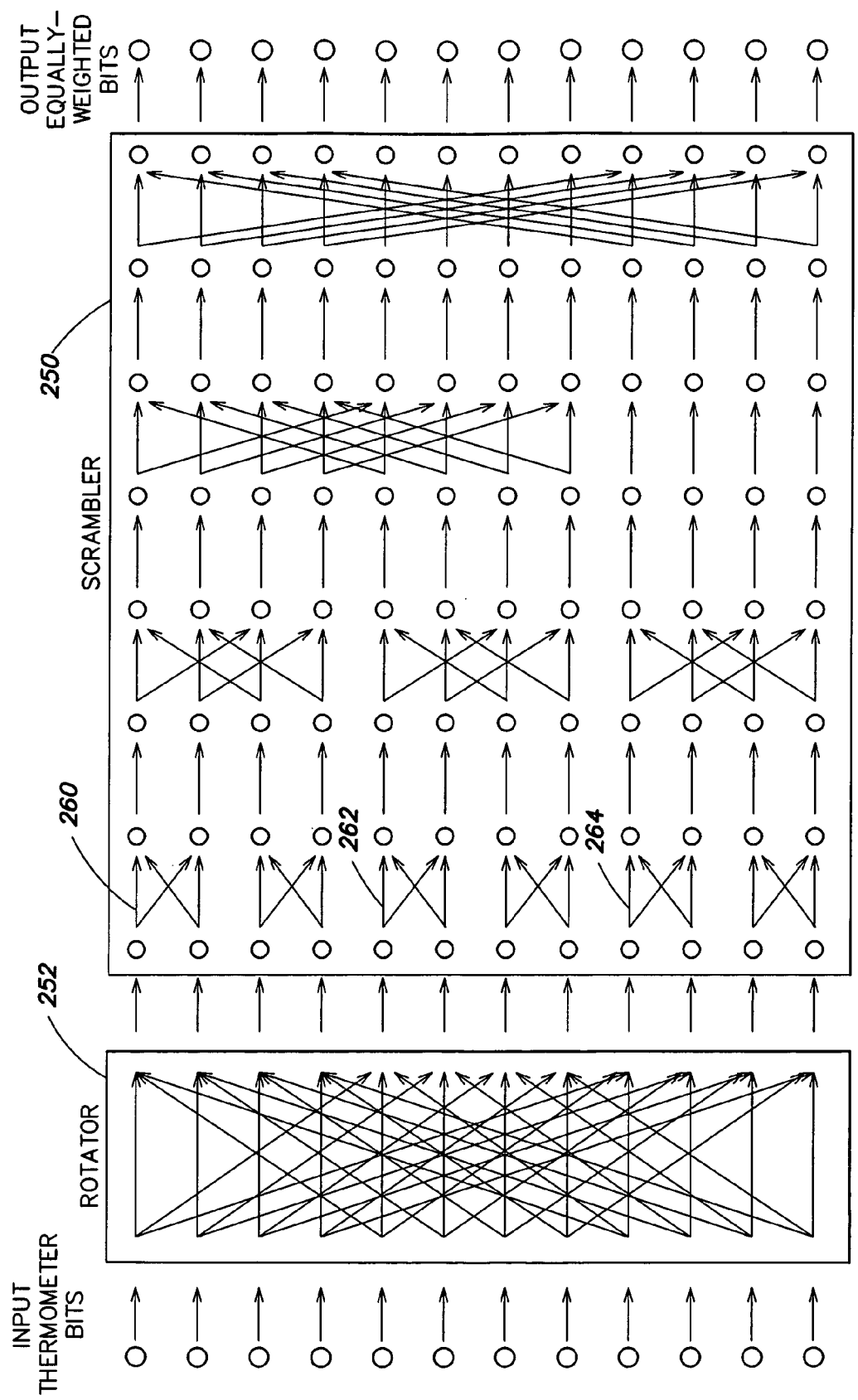
FIG. 9 is a schematic block diagram of a scrambling system, including a scrambler and a rotator, for the case where N=12 and the input is an equally-weighted code.

In the case where N=$2^k$ and k is an integer, the data-directed scrambler includes k scrambler columns. In this embodiment, successive scrambler columns process progressively higher weights in the unequally-weighted code. The unequally-weighted code may have relative bit weights of 1, 1, 2, 4, 8, 16, . . . , $2^{k-1}$.

Where N, the total number of output levels, is not an integer power of 2, the scrambler architecture shown in FIG. 2 is no longer applicable. A rotator-corrected scrambling system, based on a partial FFT butterfly architecture to handle the case where N is not an integer power of 2, is disclosed in the above-referenced copending application. A rotator-corrected scrambling system is shown in FIG. 9 for the case N=12. The scrambling system of FIG. 9 includes a 12-input scrambler 250 preceded by a 12-input rotator 252. The input to the scrambling system of FIG. 9 is an equally-weighted code, such as a thermometer code. The input thermometer bits are rotated by rotator 252 with an appropriately chosen period as specified in the above-referenced copending application. The rotated thermometer bits are scrambled by scrambler 250 using an array of swapper cells and direct connections at appropriate places in the butterfly structure as specified in the above-referenced copending application. In the example of FIG. 9, N=M×$2^k$. Thus, for N=12, we have k=2 and M=3. In the architecture of FIG. 9, rotator 252 has M=3 rotator states in which the inputs are shifted by 0, 4 and 8 steps, respectively. The rotator provides the digital signals to the inputs of scrambler 250 such that the usage of the outputs of scrambler 250 is dynamically balanced over a relatively small number of clock cycles, as described in the above-referenced copending application.

The scrambler configuration of FIG. 9 is restricted to the case where the inputs have equal weights. As discussed above, an equally-weighted code is an inefficient means of representing the input value. An unequally-weighted code can represent the input values more efficiently. For example, with k+3 bits whose weights are 1, 1, 2, 4, 8, 16, . . . , $2^{k-1}$, $2^k$ and $2^k$, it is possible to represent any integer value in the range [0, 1, 2, 3, 4, . . . , N], where N=3×$2^k$. This is more efficient than using a thermometer code, which requires N=3×$2^k$ bits. However, this efficiency is incompatible with scrambling. The code cannot be scrambled by the method described in U.S. Pat. No. 5,404,142 nor the above-referenced copending application, since only two pairs of bits have the same weight.

As described above, it is desirable to combine the efficiency of an unequally-weighted code and the noise-shaping features of scrambling. One approach is to first convert the unequally-weighted code into a thermometer code, which has equal weights, and then use a scrambler of the type shown in FIG. 9. However, this defeats the purpose of using an unequally-weighted code, since O(N $\log_2$ N) swapper cells will be required. By exploiting certain structures in an unequally-weighted code and by converting the unequally-weighted bits to the corresponding number of equally-weighted bits in stages, the present invention achieves the same scrambling result using only O(N) swapper cells. This represents a significant reduction in circuitry. If the original input is in the form of a thermometer code, the thermometer code can be converted to an appropriately selected unequally-weighted code using standard techniques and then the present invention can be utilized. Thus, the present invention may also be viewed as an efficient method of scrambling thermometer codes, using only O(N) instead of O(N $\log_2$ N) swapper cells.

In order to scramble the unequally-weighted code efficiently, the process takes advantage of the structure in the input code. The unequally-weighted input code is converted in successive stages into a structured equally-weighted code, which is scrambled using a small number of swapper cells.

However, an implementation as in the case of binary input codes, using the weights $[2^k, 2^k, 2^{k-1}, 2^{k-2}, \ldots, 8, 4, 2, 1, 1]$, will not work because of the presence of the rotator. The weights should conform to the rotational step. For example, if the rotational step is N/M, then the input code may be broken down into M code sets, each containing the same internal structure. Thus, for M=3, a suitable choice of weights is:

$$[2^{k-1}, 2^{k-2}, \ldots, 8, 4, 2, 1, 1; 2^{k-1}, 2^{k-2}, \ldots,$$
$$8, 4, 2, 1, 1; \text{ and } 2^{k-1}, 2^{k-2}, \ldots, 8, 4, 2, 1, 1]$$

The input thus has M code sets, each having the same internal structure. By way of example for the case of N=12 inputs and with the input value being 10, the thermometer code representation is:

$$10 = 0+0+1+1+1+1+1+1+1+1+1+1.$$

Instead, the modified binary code or the structured equally-weighted code can be used:

$$10 = 1 \times 4 + 1 \times 4 + 1 \times 2 + 0 \times 1 + 0 \times 1 =$$
$$[(1+1)+1+1] + \{(1+1)+1+1\} + (1+1)+0+0.$$

Thus, a modified binary code having weights of 4, 4, 2, 1, 1 is converted to a structured equally-weighted code having three code sets, each with weights (1,1), 1,1. The structured equally-weighted code may be input to the rotator-corrected scrambling system shown in FIG. 9. The same result is obtained as if the thermometer code was input to the scrambling system, as they both have the same number of equally-weighted bits that are turned on.

With the input code thus structured, it can be seen that some of the swapper cells in the scrambling system of FIG. 9 are superfluous and can be replaced by direct connections, because the two inputs of those swapper cells are constrained to be either both on or both off. In particular, $3 \times 2^{j-1}$ swapper cells are required in the jth column, for j=1, 2, 3, ..., k, and an additional $2^k$ swapper cells are required in each of the last two columns. We thus arrive at the architecture of FIG. 10, which uses 5N/3−3 swapper cells for M=3.

Figure 10:
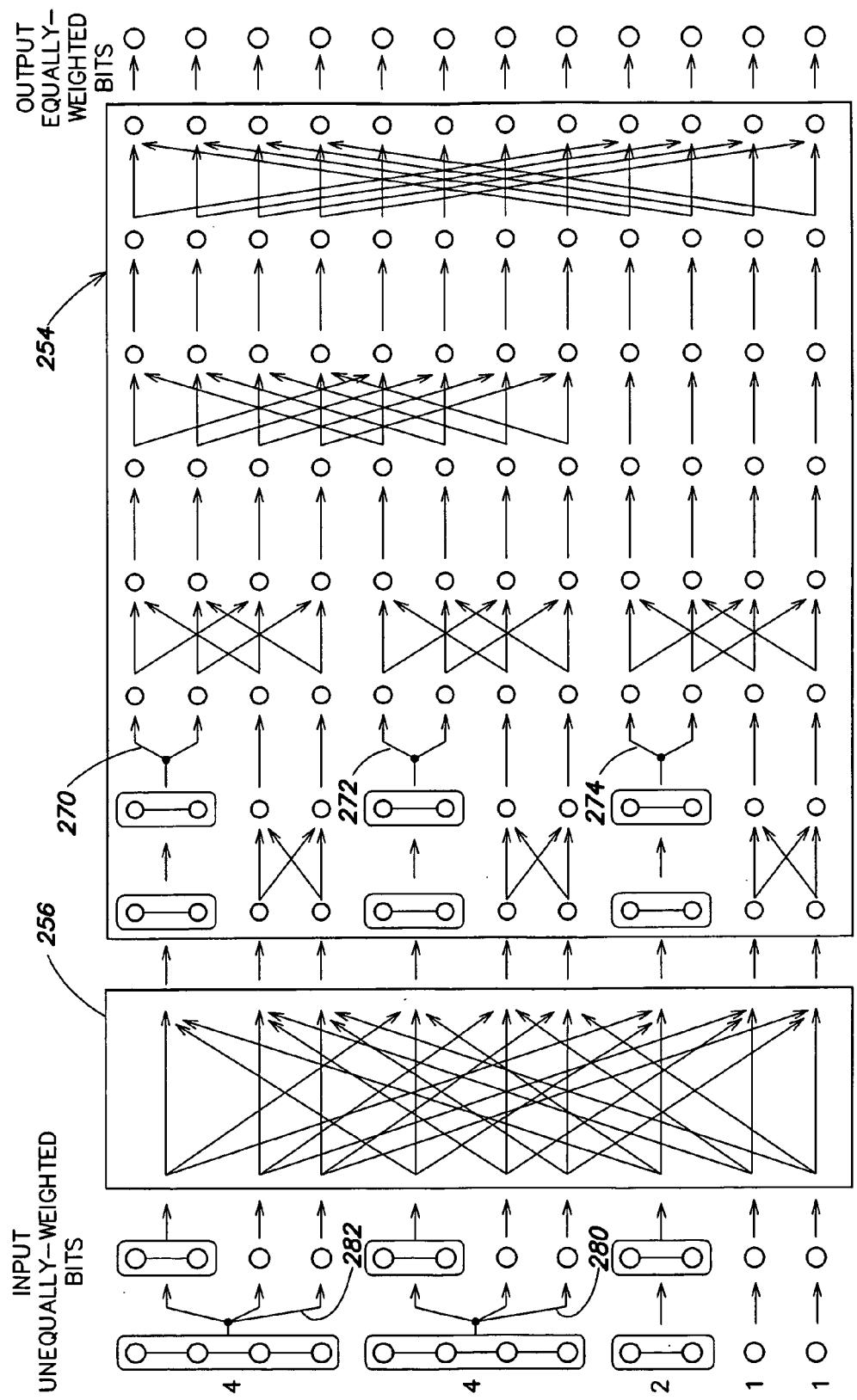
FIG. 10 is a schematic block diagram of a scrambling system, including a scrambler and a rotator, for N=12 and an input having an unequally-weighted code.

The scrambling system of FIG. 10 includes a rotator 256 and a scrambler 254, which is a modification of the scrambler 250 shown in FIG. 9. In particular, swapper cells 260, 262, and 264 in scrambler 250 of FIG. 9 are replaced by two-output digital fanouts 270, 272, and 274, respectively, in the scrambler 254 of FIG. 10. Preferably, the binary bit representing $2^j$ is not converted to the equivalent $2^j$ equally-weighted bits until these bits are ready to be swapped. The rotator 256 in the scrambling system of FIG. 10 has nine inputs. The input unequally-weighted bits are converted for input to rotator 256 by three-output digital fanouts 280 and 282. In other embodiments, the nine-input rotator 256 may be replaced by a twelve-input rotator of the type shown in FIG. 9.

In the case where $N = M \times 2^k$, k is an integer and M is an odd integer, the data-directed scrambler includes k+p scrambler columns, where p is the next integer greater than or equal to $\log_2 M$. The unequally-weighted code may have a structure including M code sets, each code set having relative bit weights of 1, 1, 2, 4, 8, 16, ..., $2^{k-1}$. The first k scrambler columns of the data-directed scrambler each comprise M sets of circuit elements. The M sets of circuit elements process respective ones of the M code sets. The last p scrambler columns may comprise swapper cells and direct connections for swapping the M code sets.

Although the above discussion has concentrated on cases where the input codes have a binary or a modified binary structure, the present invention can be used in more general cases and can handle input codes with arbitrary (not necessarily binary) weights. The appropriate design is to use an encoder which complies with the structure of the arbitrarily-weighted input code and to convert the arbitrarily-weighted input code in successive stages and in such a manner that preserves the structure of the input, to a structured equally-weighted code. Swapper cells are placed in a scrambler that conforms to the structure of the code. For higher efficiency, the weights in the input code are preferably grouped into a structure such that conversion of these weights into numbers of equal weights results in groups conforming to the structure of the swapper cells. Thus, when 2×2 swapper cells are used in the scrambler, the weights in the input code should be arranged into a structure that provides groups each consisting of $2^j$ elements for some integer j. For example, given the weights [1, 2, 2, 3], the arrangement 3+1+2+2= (3+1)+(2+2) is preferred to the arrangement 3+2+2+1. However, there can be much flexibility in the possible arrangements for any given set of input weights. The appropriate arrangements in the general case are apparent to those skilled in the art.

The scrambling system of FIG. 9 utilizes 12-input rotator 252 having three rotator states in which the inputs are shifted by 0, 4 and 8 steps, respectively. A six-input rotator 300 having three rotator states in which inputs are shifted by 0, 2 and 4 steps, respectively, is described with reference to FIGS. 11, 12A–12C, 13, 14A and 14B. The rotator-corrected scrambling system is described in more detail in the above-referenced copending application. It will be understood that rotators with different numbers of inputs, different numbers of rotator states and different shifts per rotator state can be constructed in an analogous manner. The rotator may be viewed as a barrel shifter that is preprogrammed to operate in a predetermined sequence.

Figure 11:
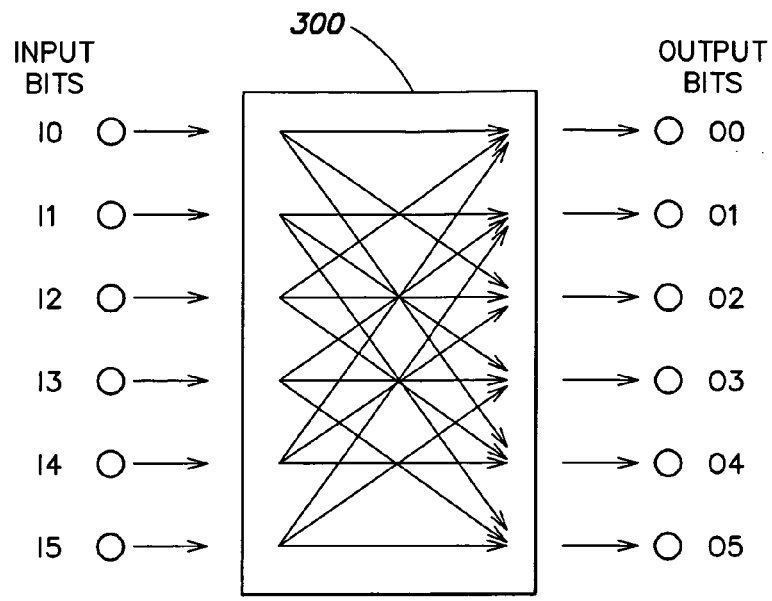
FIG. 11 is a schematic diagram of a six-input rotator having three rotator states.
Figure 12A:
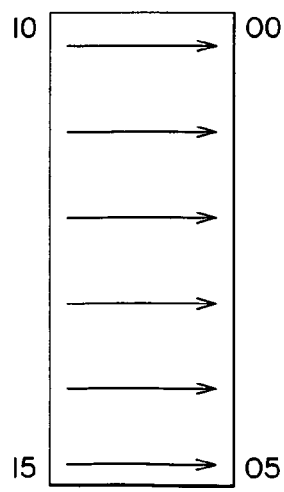
FIGS. 12A–12C illustrate the rotator states of the rotator shown in FIG. 11.
Figure 12B:
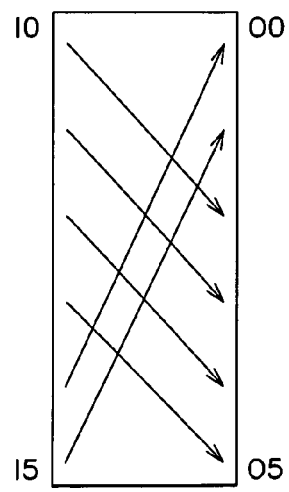
Figure 12C:
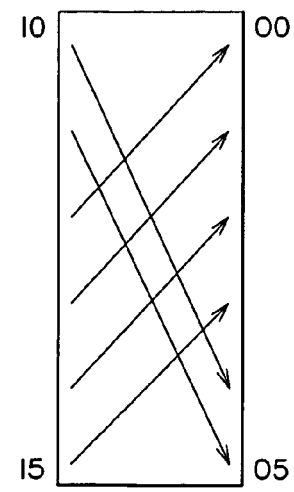
Figure 13:
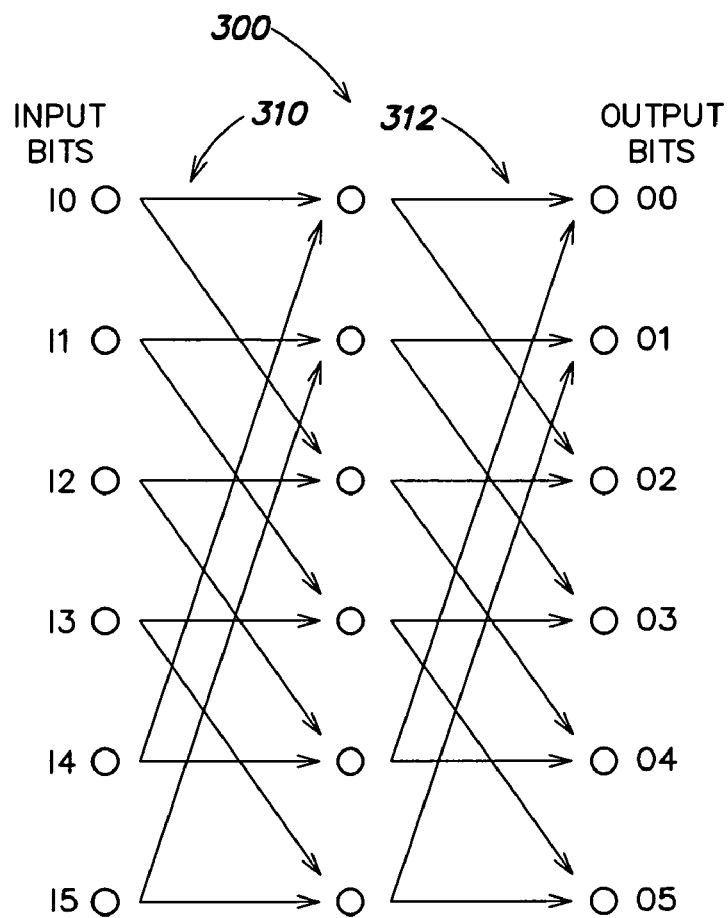
FIG. 13 is a schematic diagram of a two-column rotator having six inputs and three rotator states.

A schematic diagram of an example of rotator 300 for the case of six inputs and three rotator states is shown in FIG. 11. The individual rotator states are shown in FIGS. 12A–12C. A rotator topology for implementing the rotator of FIG. 11 is shown in FIG. 13. In this example, the jth input is mapped directly to the jth output at clock cycles 0, 3, 6, 9, ...; to the (j+2)th output at clock cycles 1, 4, 7, 10, ...; and to the (j+4)th output at clock cycles 2, 5, 8, 11, ..., with the indices taken modulo N. However, this choice is for the purpose of illustration and is not the only possible choice of rotation step. There is much flexibility to accommodate other constraints for a particular application.

In the example of FIGS. 11 and 12A–12C, rotator 300 has three rotator states. In a first rotator state shown in FIG. 12A, inputs I0–I5 are connected directly to outputs O0–O5, respectively (no shift). In a second rotator state shown in FIG. 12B, each input is shifted by two steps. Thus, input I0 is shifted to output O2, input I1 is shifted to output O3, etc. The final two inputs I4 and I5 are wrapped around and are shifted to outputs O0 and O1, respectively. In a third rotator state shown in FIG. 12C, each input is shifted by four steps. Thus, input I0 is shifted to output O4, input I1 is shifted to output O5, input I2 is shifted to output O0, etc. In the next clock cycle, the rotator returns to the first rotator state shown in FIG. 12A in a repeating sequence.

An algorithm for implementing rotator 300 with six inputs and three rotator states is shown in FIG. 13. Rotator 300 is implemented as two columns, or sets, including a first column 310 and a second column 312. Each of columns 310 and 312 maps its inputs directly to the respective outputs without any shift or shifts each input by N/M=2 steps. Together, columns 310 and 312 may rotate inputs I0–I5 by 0, 2 or 4 steps, as shown in FIGS. 12A–12C.

Figures 14A, 14B:
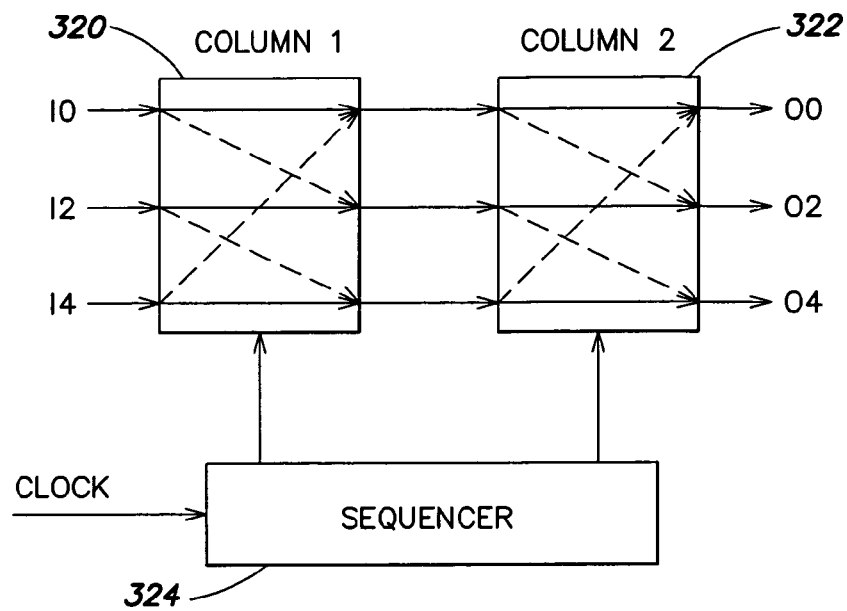
FIG. 14A is a schematic block diagram of a set of rotator cells for implementing one-half of a six-input rotator having three rotator states.
FIG. 14B is a table that illustrates the rotator states of the rotator cells shown in FIG. 14A.

An implementation of rotator 300 is described with reference to FIGS. 14A and 14B. As shown in FIG. 14A, a rotator cell 320 in column 310 receives inputs I0, I2 and I4 and supplies outputs to a rotator cell 322 in column 312. Rotator cell 322 provides outputs O0, O2 and O4. Each of rotator cells 320 and 322 shifts its inputs by zero steps (indicated by solid lines) or two steps (indicated by dashed lines) in response to control signals from a controller implemented as a sequencer 324. Two additional rotator cells (not shown), one in each column, having the same configuration are utilized for rotating inputs I1, I3 and I5 to provide outputs O1, O3 and O5. The sequencer 324 generates binary control signals in response to a clock in accordance with the table of FIG. 14B. In the table of FIG. 14B, DIRECT indicates a zero-step shift (no shift) and SHIFT indicates a two-step shift. Sequencer 324 may be implemented as a three-state counter for a rotator having three rotator states.

The rotator 300 of FIG. 11 thus may be implemented as two or more columns, or sets, of rotator cells and a sequencer. Each set of rotator cells has N inputs and N outputs, and the sets of rotator cells are connected in series. Each set of rotator cells passes its inputs directly to its outputs (no shift) or shifts its inputs by a predetermined number of steps in response to a control signal provided by the sequencer. The sets of rotator cells provide a selected number of rotator states, and the sequencer advances through the rotator states in a periodic manner.

When M is not a prime number but a composite, it is desirable to use an encoder consisting of a series of rotators, with each rotator carrying out the rotation for a factor of M, as this reduces the amount of hardware while retaining the same performance. For example, when M=15=3×5 using two rotators, one with three rotational steps and the other with five rotational steps, connected in series, is more efficient in terms of hardware requirements than using one rotator with 15 rotational steps.

The number of rotator states is selected based, at least in part, on the frequency band of the digital signals being converted. In particular, the number M of rotator states should be selected such that the rotator frequency $f_S/M$ is outside the signal band of the digital signals being converted. This may vary depending on whether a low-pass filter or a band-pass filter is being utilized in the converter.

Figure 15:
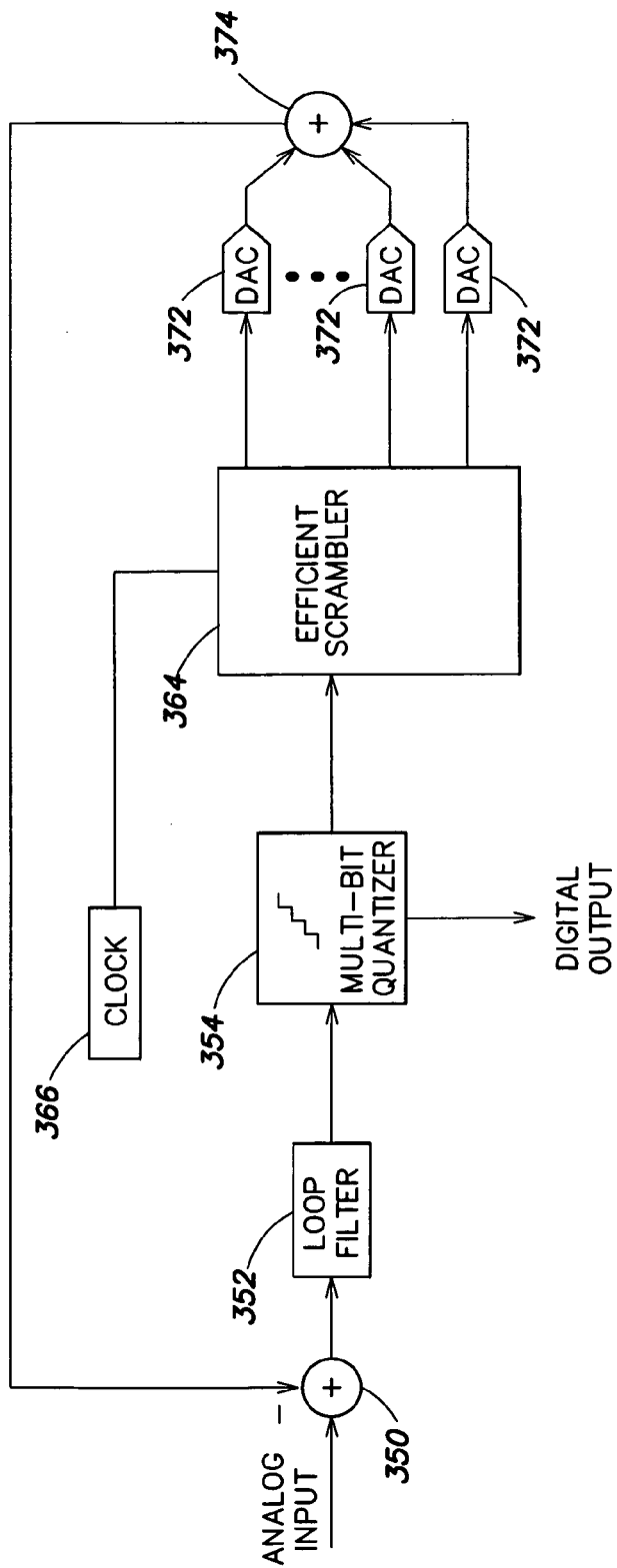
FIG. 15 is a schematic block diagram of a multi-bit, noise-shaping analog-to-digital converter including an efficient scrambling system in accordance with a first embodiment of the invention.

The efficient scramblers, shown by way of example in FIGS. 7A, 7B and 10 and described herein, may be used as part of a multi-bit digital-to-analog converter in a multi-bit, noise-shaping analog-to-digital converter, as shown in the embodiment of FIG. 15. The converter includes summing circuit 350, loop filter 352, multi-bit quantizer 354, efficient scrambler 364, clock 366, DAC elements 372 and a summing circuit 374. The analog outputs of DAC elements 372 are summed by summing circuit 374, and the sum is subtracted from the analog input by summing circuit 350 to form a closed loop. In the embodiment of FIG. 15, scrambler 364 has N outputs, where N is an integer power of 2. The efficient scrambler 364 may be configured as described above.

Figure 16:
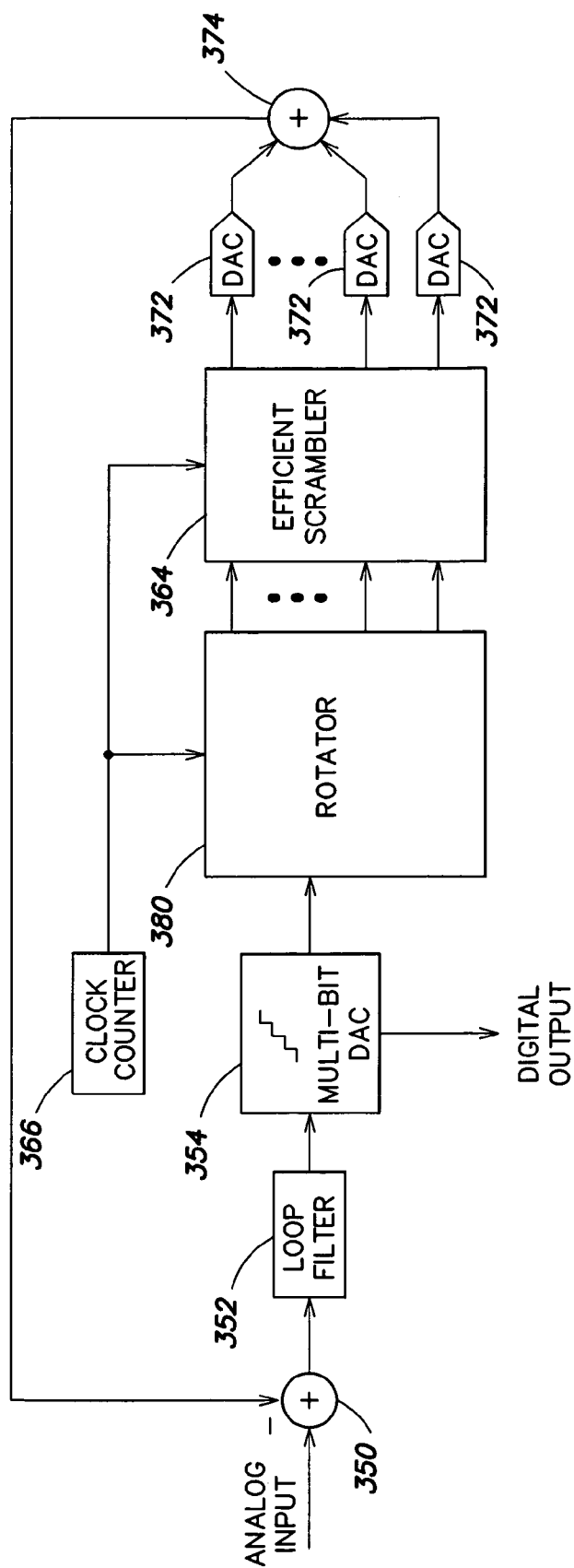
FIG. 16 is a schematic block diagram of a multi-bit, noise-shaping analog-to-digital converter including an efficient scrambling system in accordance with a second embodiment of the invention.

A second embodiment of a multi-bit, noise-shaping analog-to-digital converter using the efficient scrambler described herein is shown in FIG. 16. Like elements in FIGS. 15 and 16 have the same reference numerals. In the embodiment of FIG. 16, scrambler 364 has N outputs, where N is not an integer power of 2. In this case, a rotator 380 precedes scrambler 364, as described above in connection with the example of FIG. 10.

Figure 17:
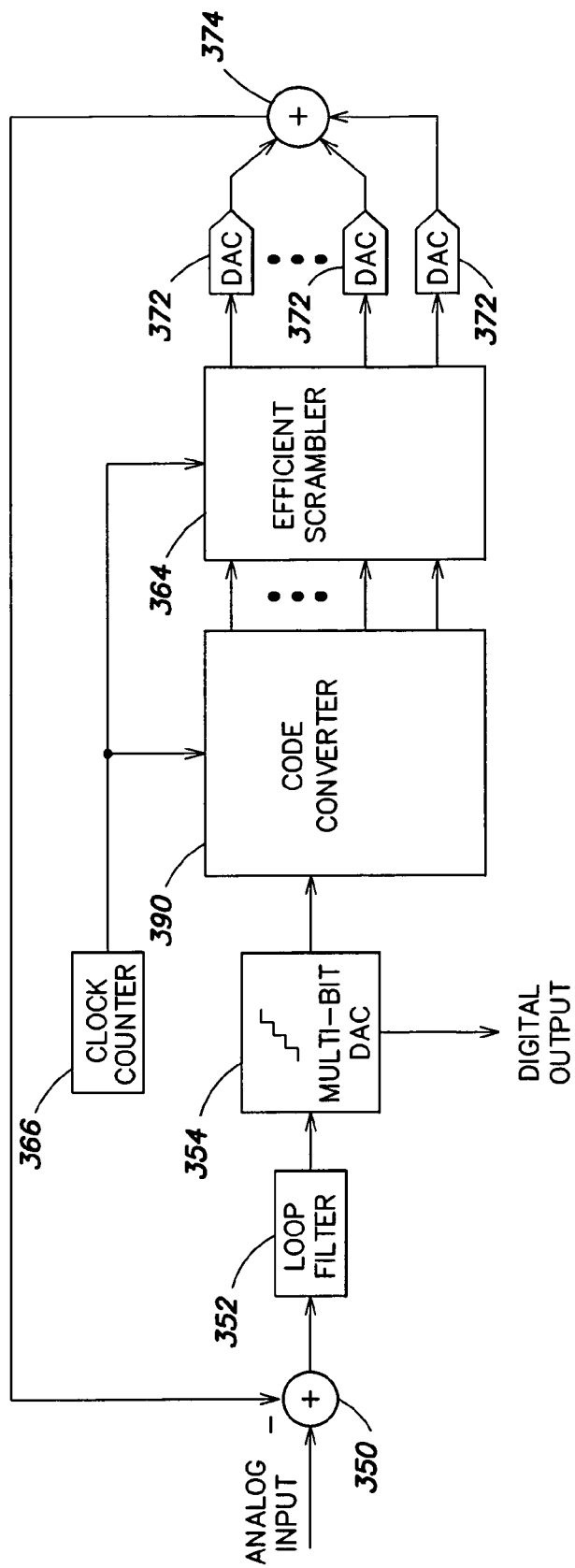
FIG. 17 is a schematic block diagram of a multi-bit, noise-shaping analog-to-digital converter including an efficient scrambling system in accordance with a third embodiment of the invention.

A third embodiment of a multi-bit, noise-shaping analog-to-digital converter using the efficient scrambler described herein is shown in FIG. 17. Like elements in FIGS. 15–17 have the same reference numerals. In the embodiment of FIG. 17, a code converter 390 precedes scrambler 364. Code converter 390 converts the digital output of multi-bit quantizer 354 to a structured equally-weighted code. The efficient scrambler 364 may correspond to the scrambler shown in FIG. 8 and described above.

The results achieved with the multi-bit, noise-shaping converters of FIGS. 15 and 16 are the same as the results achieved with the prior art converter of FIG. 1. In a multi-bit sigma-delta loop, the thermometer coded output bits represent the total input signal plus noise-shaped terms. The performance of such a noise-shaping converter is degraded by non-ideal components, such as mismatch, heterogeneity and thermal noise. In fact, an implementation without a scrambler will produce undesirable harmonic distortions in the signal band. Using the scrambling techniques described in U.S. Pat. No. 5,404,142 and the above-referenced copending application in a multi-bit sigma-delta loop, one can obtain, in the signal band, a spectral density of noise comparable to that obtained by using ideal components. The error is then due mainly to thermal noise. An advantage of using this approach is that if a particular output weight is incorrect, most of the error occurs at high frequencies and very little of the error occurs in the frequency band of interest. Also, since each output bit represents one input bit plus noise-shaped terms, an error in the output weight does not cause harmonic distortion. Moreover, the control logic is simple, since it is local and requires only single-bit memories. However, whereas U.S. Pat. No. 5,404,142 and the above-referenced copending application achieve such results, the present invention provides an advantage over those methods with respect to reduced circuitry. In particular, an implementation of the present invention as shown in FIGS. 15–17 requires only O(N) swapper cells, plus O($\log_2$ N) digital comparators to convert the result of the thermometer code to a structured code, as described below.

To compare the present invention with related implementations in terms of resources required, it will be assumed that the input is thermometer encoded, with N equally-weighted levels. Then the implementation of the present invention requires an extra thermometer-to-binary converter if N=$2^k$, or a similar converter to organize the equally-weighted levels into a structured code if N is not equal to $2^k$. However, the cost is small, because only O($\log_2$ N) comparisons are required if a standard thermometer to binary converter is used. Specifically, the number of comparisons C(N) is:

$C(N)=\log_2 N$ for $N=2^k$ $C(N)=\log_2(N/3)+2$ for $N=3\times 2^k$ $C(N)=\log_2(N/5)+3$ for $N=5\times 2^k$ In terms of the number of swapper cells required, implementations of the present invention are significantly more efficient than other implementations. In other implementations, such as those disclosed in U.S. Pat. No. 5,404,142 and the above-referenced copending application, the number of swapper cells S(N) required is O(N log₂ N). Specifically, $$S(N)=(N/2)\log_2 N \text{ for } N=2^k$$

$$S(N)=(N/2)\log_2 (N/3)+2N/3 \text{ for } N=3\times 2^k$$

$$S(N)=(N/2)\log_2(N/5)+N \text{ for } N=5\times 2^k$$

The present invention achieves a better scaling, namely, S(N)=O(N). In particular, $$S(N)=N-1 \text{ for } N=2^k$$

$$S(N)=5N/3-3 \text{ for } N=3\times 2^k$$

$$S(N)=2N-5 \text{ for } N=5\times 2^k$$

The improvement is substantial, especially for large N.

By judiciously replacing some swapper cells in the scrambler with direct connections, the efficiency of the scrambler has been significantly improved. This, together with a thermometer-to-binary converter and a hierarchy of digital fanouts that convert a thermometer code into a structured and equally-weighted code in successive stages, provides a way to achieve efficient multi-bit digital-to-analog conversion for an arbitrary number of quantization levels, thereby gaining noise benefits, while retaining the excellent distortion characteristics of single-bit converters. This improvement in comparison with other implementations which require many more swapper cells, translates directly into reduced chip area, power consumption and manufacturing cost. The performance of the efficient scrambler described herein is identical to those of the scramblers described in U.S. Pat. No. 5,404,142 and the above-referenced copending application, with no loss of speed or accuracy. The efficient scrambler permits a relaxation of analog matching requirements by as much as 30 dB compared to other approaches, such as the scrambling techniques disclosed in U.S. Pat. No. 5,404,142 and the above-referenced copending application. This allows very high resolution and scalable noise shaping analog-to-digital converters and digital-to-analog converters to be implemented in modest cost CMOS processes.

It should be understood that various changes and modifications of the embodiments shown in the drawings described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A data-directed scrambler for processing digital signals having an unequally-weighted code, comprising:
   inputs for receiving unequally-weighted bits of an input signal;
   outputs for supplying N scrambled bits of an output signal; and
   two or more scrambler columns connected in series between said inputs and said outputs, one or more of said scrambler columns including a swapper cell and a digital fanout, wherein least significant bits in the unequally-weighted code are input to a swapper cell and higher order bits in the unequally-weighted code are input to respective digital fanouts.

2. A data-directed scrambler as defined in claim 1, wherein $N=2^k$ and k is an integer, and wherein said data-directed scrambler includes k scrambler columns.

3. A data-directed scrambler as defined in claim 2, wherein successive scrambler columns process progressively higher weights in the unequally-weighted code.

4. A data-directed scrambler as defined in claim 2, wherein each swapper cell connects two equally-weighted bits to two output terminals, either directly or reversely, in response to a select signal, and each digital fanout converts an input bit to a number of equally-weighted bits in accordance with the weight of the input bit.

5. A data-directed scrambler as defined in claim 2, wherein the unequally-weighted code has relative bit weights of $1, 1, 2, 4, 8, 16, \ldots, 2^{k-1}$.

6. A data-directed scrambler as defined in claim 2, comprising N-1 swapper cells.

7. A data-directed scrambler as defined in claim 6, wherein each of said swapper cells comprises:
   two input terminals to receive respective inputs and two output terminals to produce corresponding outputs;
   circuitry responsive to a select signal for connecting the two input terminals to the two output terminals, either directly or reversely; and
   logic for generating the select signal.

8. A data-directed scrambler as defined in claim 7, wherein said logic comprises logic circuitry for storing the integrated difference of past swapper output signals, for determining a new value of the select signal based on the current two input values to the swapper cell and the stored integrated difference, and for updating the value of the stored integrated difference.

9. A data-directed scrambler as defined in claim 2, wherein a first scrambler column includes at least one swapper cell and at least one digital fanout and wherein a last scrambler column includes $2^{k-1}$ swapper cells.

10. A data-directed scrambler as defined in claim 1, wherein $N=M\times 2^k$, k is an integer and M is an odd integer, and wherein said data-directed scrambler includes k+p scrambler columns, where p is the next integer greater than or equal to $\log_2 M$.

11. A data-directed scrambler as defined in claim 10, wherein the unequally-weighted code has a structure including M code sets, each code set having relative bit weights of $1, 1, 2, 4, 8, 16, \ldots, 2^{k-1}$, and wherein the first k scrambler columns of said data-directed scrambler comprise M sets of circuit elements, wherein the M sets of circuit elements process respective ones of the M code sets.

12. A data-directed scrambler as defined in claim 11, wherein successive ones of the first k scrambler columns process progressively higher weights in the respective M code sets.

13. A data-directed scrambler as defined in claim 10, wherein each swapper cell connects two equally-weighted bits to two output terminals, either directly or reversely, in response to a select signal, and each digital fanout converts an input bit to a number of equally-weighted bits in accordance with the weight of the input bit.

14. A data-directed scrambler as defined in claim 11, wherein the last p scrambler columns comprise swapper cells and direct connections for swapping the M code sets.

15. A data-directed scrambler as defined in claim 10, wherein M=3 and said scrambler columns include 5N/3−3 swapper cells.

16. A data-directed scrambler as defined in claim 10, wherein M=5 and said scrambler columns include 2N−5 swapper cells.

17. A data-directed scrambler as defined in claim 10, wherein each of said scrambler columns includes one or more swapper cells and wherein each of said swapper cells comprises:
- two input terminals to receive respective inputs and two output terminals to produce corresponding outputs;
- circuitry responsive to a select signal for connecting the two input terminals to the two output terminals, either directly or reversely; and
- logic for generating the select signal.

18. A data-directed scrambler as defined in claim 17, wherein said logic comprises logic circuitry for storing the integrated difference of past swapper output signals, for determining a new value of the select signal based on the current two input values to the swapper cell and the stored integrated difference, and for updating the value of the stored integrated difference.

19. Apparatus for processing digital signals having an unequally-weighted code, comprising:
- a data-directed scrambler having inputs for receiving the digital signals and N outputs, wherein $N=M\times 2^k$, k is an integer and M is an odd integer, said data-directed scrambler including k+p scrambler columns, where p is the next integer greater than or equal to $\log_2 M$ connected in series between the inputs and the N outputs, wherein one or more of said scrambler columns includes a swapper cell and a digital fanout; and
- a rotator for advancing the inputs to said data-directed scrambler through M rotator states, wherein the inputs of said rotator are shifted by 0, N/M, 2N/M, ..., (M−1) N/M steps in respective rotator states.

20. Apparatus as defined in claim 19, wherein the unequally-weighted code has a structure including M code sets, each code set having relative bit weights of 1, 1, 2, 4, 8, 16, ..., $2^{k-1}$, and wherein the first k scrambler columns of said data-directed scrambler comprise M sets of circuit elements, wherein the M sets of circuit elements process respective ones of the M code sets.

21. Apparatus as defined in claim 20, wherein successive ones of the first k scrambler columns process progressively higher weights in the respective M code sets.

22. Apparatus as defined in 19, wherein each swapper cell connects two equally-weighted bits to two output terminals, either directly or reversely, in response to a select signal, and each digital fanout converts an input bit to a number of equally-weighted bits in accordance with the weight of the input bit.

23. Apparatus as defined in claim 20, wherein the last p scrambler columns of said data-directed scrambler comprise swapper cells and direct connections for swapping the M code sets.

24. Apparatus as defined in claim 19, wherein M=3 and said data-directed scrambler includes 5N/3−3 swapper cells.

25. Apparatus as defined in claim 19, wherein M=5 and said data-directed scrambler includes 2N−5 swapper cells.

26. Apparatus as defined in claim 19, wherein each of said scrambler columns comprises one or more swapper cells and wherein each of said swapper cells comprises:
- two input terminals to receive respective inputs and two output terminals to produce corresponding outputs;
- circuitry responsive to a select signal for connecting the two input terminals to the two output terminals, either directly or reversely; and
- logic for generating the select signal.

27. Apparatus as defined in claim 26, wherein said logic comprises logic circuitry for storing the integrated difference of past swapper output signals, for determining a new value of the select signal based on the current two input values to the swapper cell and the stored integrated difference, and for updating the value of the stored integrated difference.

28. Apparatus as defined in claim 19, wherein said rotator comprises two or more columns of rotator cells connected in series between inputs and outputs of said rotator, wherein each of said columns of rotator cells passes its inputs directly to its outputs or shifts its inputs by a predetermined number of steps in response to a control signal, said rotator further comprising a controller for providing control signals to said columns of said rotator cells in response to a clock signal.

29. A data-directed scrambler for processing digital signals, comprising:
- inputs for receiving the digital signals and N outputs, wherein $N=2^k$ and k is an integer; and
- k scrambler columns connected in series between the inputs and the N outputs, wherein the jth scrambler column includes $2^{j-1}$ swapper cells for j=1 to k.

30. A data-directed scrambler as defined in claim 29, wherein successive scrambler columns process progressively higher weights in the unequally-weighted code.

31. A data-directed scrambler as defined in claim 29, wherein the unequally-weighted code has relative bit weights of 1, 1, 2, 4, 8, 16, ..., $2^{k-1}$.

32. A data-directed scrambler as defined in claim 29, comprising N−1 swapper cells.

33. A data-directed scrambler as defined in claim 32, wherein each swapper cell connects two equally-weighted bits to two output terminals, either directly or reversely, in response to a select signal.

34. A data-directed scrambler as defined in claim 29, wherein the scrambler columns are configured for receiving an unequally-weighted code.

35. A data-directed scrambler as defined in claim 34, wherein one or more of the scrambler columns includes a digital fanout for converting an input bit of the unequally-weighted code to a number of equally-weighted bits in accordance with the weight of the input bit.

36. A data-directed scrambler as defined in claim 29, wherein said scrambler columns are configured for receiving a structured equally-weighted code, wherein bits of the code that are constrained to be all on or all off are assigned to bit groups, and wherein bit groups of the structured equally-weighted code are input to respective scrambler columns in accordance with the number of bits in the bit groups.

37. A data-directed scrambler for processing digital signals having a structured equally-weighted code, wherein bits of the code that are constrained to be all on or all off are assigned to bit groups, comprising:
- inputs for receiving N bits of an input signal having the structured equally-weighted code;
- outputs for supplying N scrambled bits of an output signal; and
- two or more scrambler columns connected in series between said inputs and said outputs, each of said scrambler columns including at least one swapper cell, wherein bit groups of the structured equally-weighted code are input to respective scrambler columns in accordance with the number of bits in the bit groups.

38. A data-directed scrambler as defined in claim 37, wherein $N=2^k$ and k is an integer, and wherein said data-directed scrambler includes k scrambler columns.

39. A data-directed scrambler as defined in claim 38, comprising N−1 swapper cells.

40. A data-directed scrambler as defined in claim 39, wherein each swapper cell connects two equally-weighted bits to two output terminals, either directly or reversely, in response to a select signal.

41. A data-directed scrambler as defined in claim 37, wherein N=M×$2^k$, k is an integer and M is an odd integer, and wherein said data-directed scrambler includes k+p scrambler columns, where p is the next integer greater than or equal to $\log_2$ M.

42. A method for processing digital signals having an unequally-weighted code, comprising the steps of:
provided a data-directed scrambler including inputs for receiving unequally-weighted bits of an input signal, outputs for supplying N scrambled bits of an output signal, and two or more scrambler columns connected in series between said inputs and said outputs, one or more of said scrambler columns including a swapper cell and a digital fanout;
supplying least significant bits in the unequally-weighted code to a swapper cell; and
supplying higher order bits in the unequally-weighted code to respective digital fanouts.

43. A method as defined in claim 42, wherein the step of supplying least significant bits further comprises connecting two equally-weighted bits to two output terminals of a swapper cell, either directly or reversely, in response to a select signal and wherein the step of supplying higher order bits further comprises converting an input bit to a number of equally-weighted bits in accordance with the weight of the input bit.

44. A method as defined in claim 42, wherein N=$2^k$ and k is an integer.

45. A method as defined in claim 42, wherein N=M×$2^k$, k is an integer and M is an odd integer.

46. A method for processing digital signals having a structured equally-weighted code, wherein bits of the code that are constrained to be all on or all off are assigned to bit groups, comprising the steps of:
providing a data-directed scrambler including inputs for receiving N bits of an input signal having the structured equally-weighted code, outputs for supplying N scrambled bits of an output signal, and two or more scrambler columns connected in series between said inputs and said outputs, each of said scrambler columns including at least one swapper cell; and
processing bit groups of the structured equally-weighted code in respective scrambler columns in accordance with the number of bits in the bit groups.

47. A method as defined in claim 46, wherein N=$2^k$ and k is an integer.

48. A method as defined in claim 46, wherein N=M×$2^k$, k is an integer and M is a positive integer.

* * * * *